(12) United States Patent
Shibata

(10) Patent No.: US 9,424,913 B2
(45) Date of Patent: Aug. 23, 2016

(54) HIGH-SPEED READABLE SEMICONDUCTOR STORAGE DEVICE

(71) Applicant: KABUSHIKI KAISHA TOSHIBA, Minato-ku (JP)

(72) Inventor: Noboru Shibata, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/000,239

(22) Filed: Jan. 19, 2016

(65) Prior Publication Data

US 2016/0133318 A1    May 12, 2016

Related U.S. Application Data

(63) Continuation of application No. 13/599,193, filed on Aug. 30, 2012, now Pat. No. 9,263,131.

(30) Foreign Application Priority Data

Dec. 2, 2011    (JP) ................................ 2011-264859

(51) Int. Cl.
  *G11C 11/34*    (2006.01)
  *G11C 11/56*    (2006.01)
  *G11C 16/26*    (2006.01)

(52) U.S. Cl.
  CPC ............ *G11C 11/5642* (2013.01); *G11C 16/26* (2013.01)

(58) Field of Classification Search
  CPC ........................... G11C 11/5642; G11C 16/26
  See application file for complete search history.

(56) References Cited

U.S. PATENT DOCUMENTS

| 7,016,226 B2 | 3/2006 | Shibata et al. |
| 7,394,691 B2 | 7/2008 | Shibata et al. |
| 7,813,171 B2 | 10/2010 | Shibata et al. |
| 2007/0279982 A1 | 12/2007 | Shibata et al. |

FOREIGN PATENT DOCUMENTS

| JP | 2004-192789 | 7/2004 |
| JP | 2009-272016 | 11/2009 |
| WO | WO 2007/079124 A1 | 7/2007 |

*Primary Examiner* — Richard Elms
*Assistant Examiner* — Mohammed A Bashar
(74) *Attorney, Agent, or Firm* — Oblon, McClelland, Maier & Neustadt, L.L.P

(57) ABSTRACT

According to one embodiment, a semiconductor storage device includes a memory cell array and a controller. The memory cell array includes a first memory cell, a second memory cell, a third memory cell, and a fourth memory cell. The controller writes data having n values (n is natural numbers of 2 or more to k or less) in the second memory cell and simultaneously writes the fourth memory cell, after writing the data having the n values in the first memory cell. When reading the data from the first memory cell, the controller reads data of the first memory cell and the third memory cell which is selected simultaneously with the first memory cell and, changes a read voltage of the first memory cell based on the data read from the third memory cell.

10 Claims, 31 Drawing Sheets

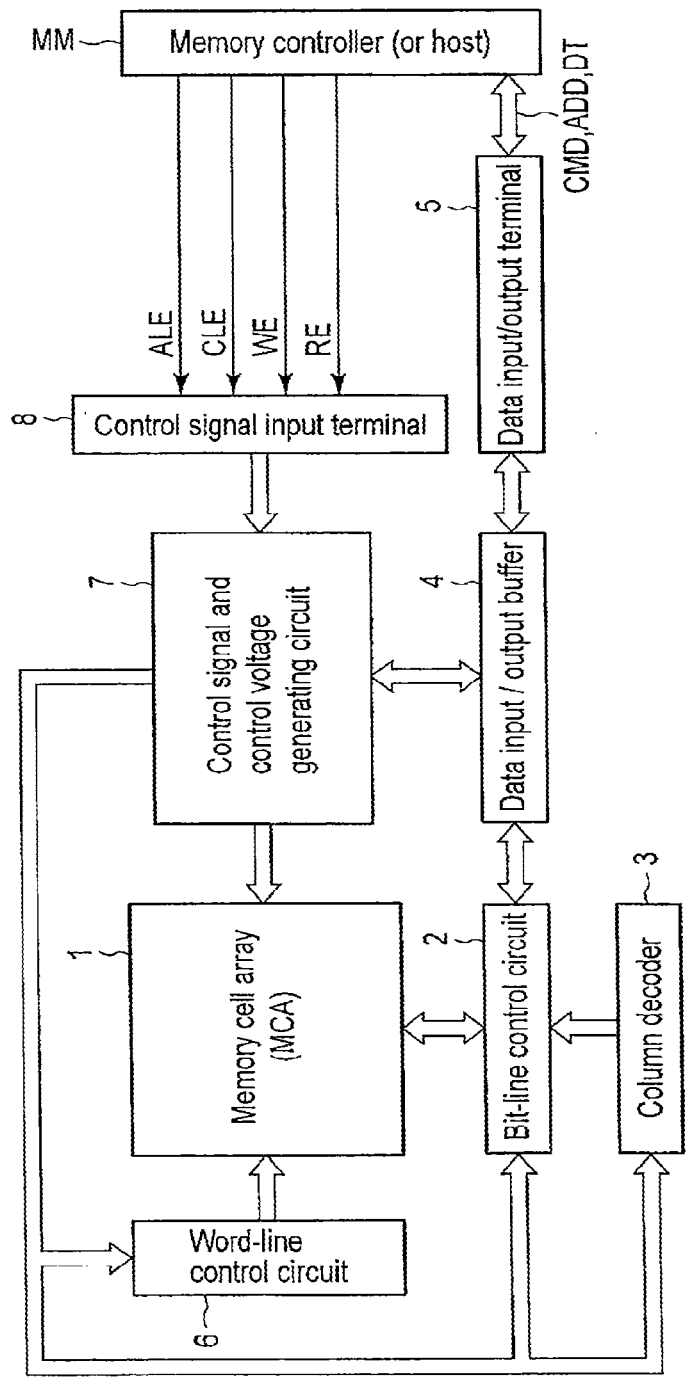
F I G. 1

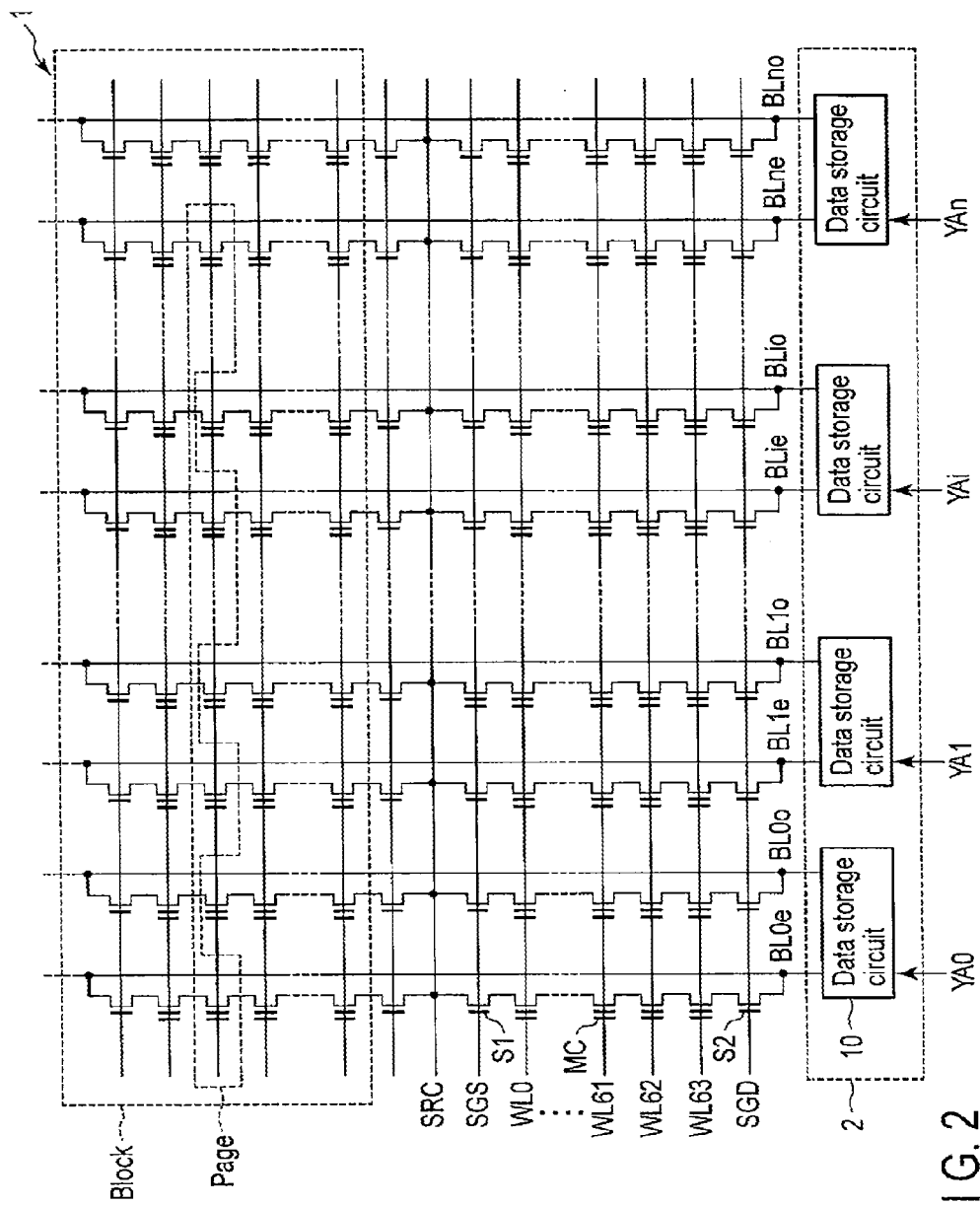
F I G. 2

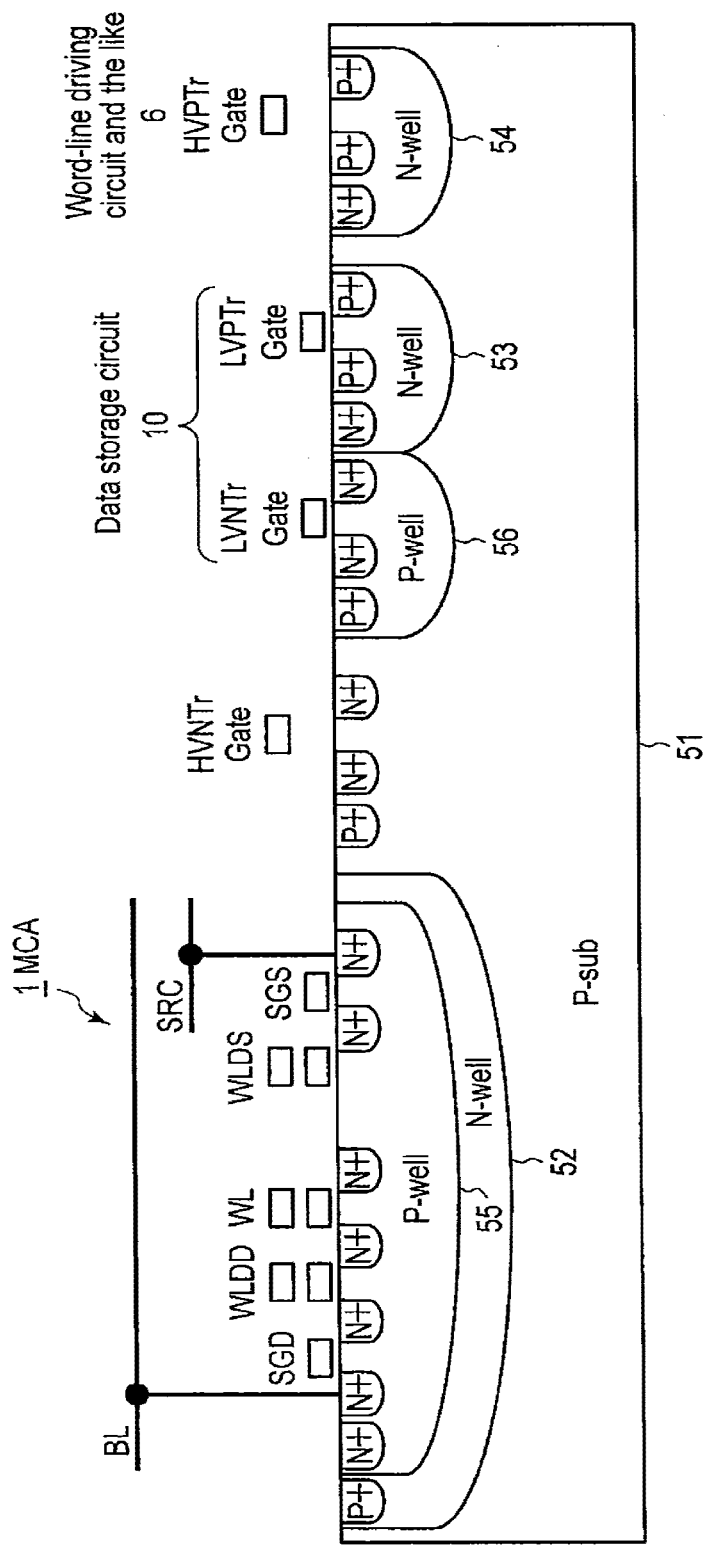
F I G. 5

|  | Cell (P-Well) | Cell (N-Well) | H.V.Tr (P-sub) | L.V.Nch (P-well) | L.V.Pch (N-well) | H.V.Pch (N-well) |
| --- | --- | --- | --- | --- | --- | --- |
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vss(0V) | Vss(0V) | Vss(0V) | Vss(0V) | Vdd(2.5V) | Vdd(2.5V)/Vreadh |

F I G. 6

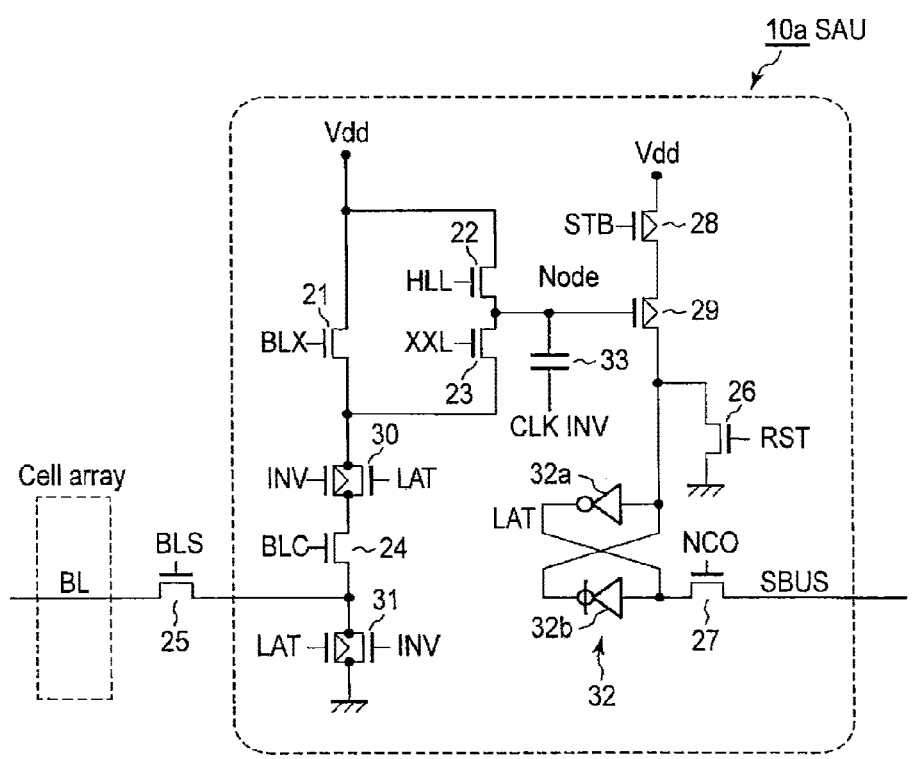
F I G. 7

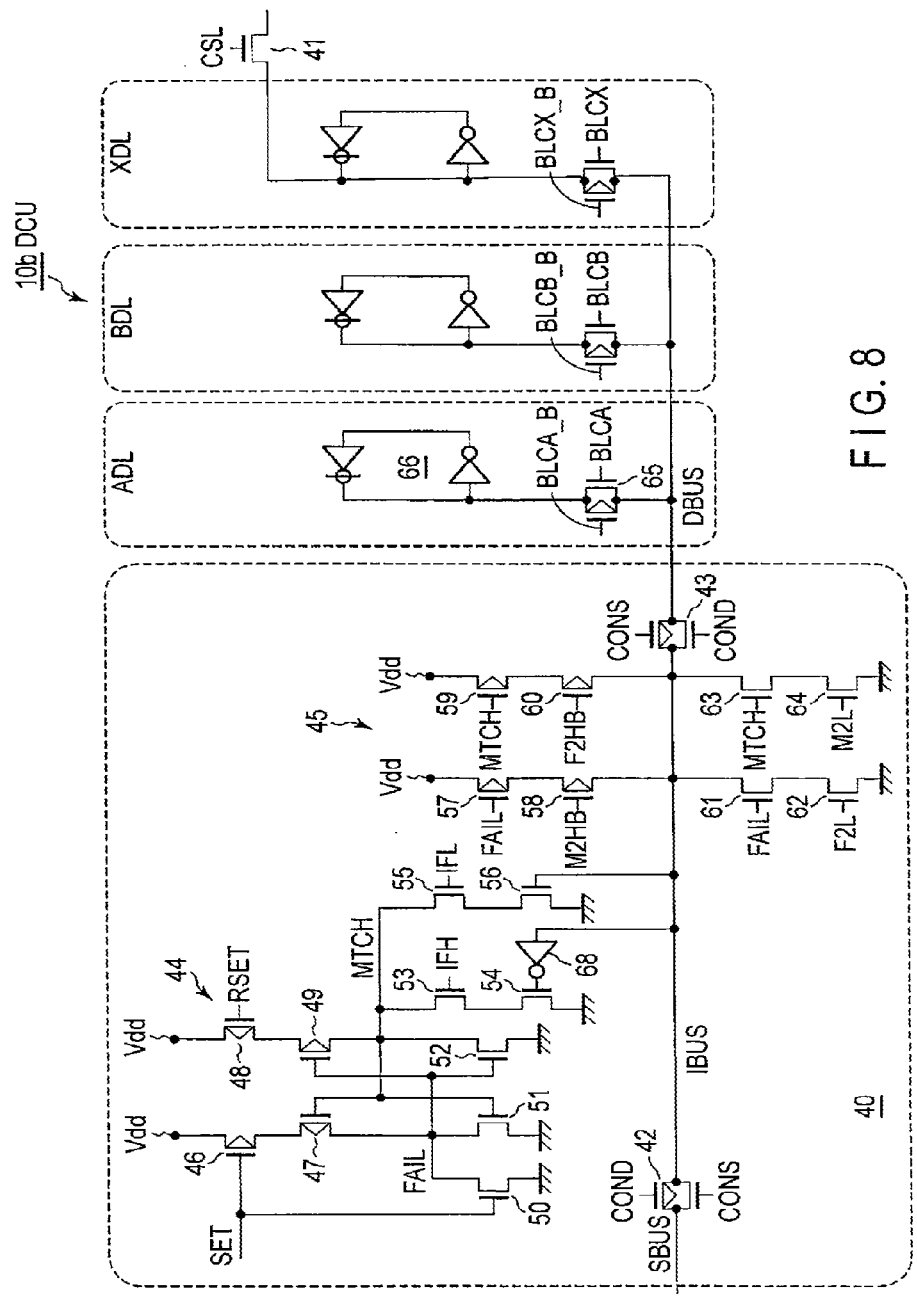
F I G. 8

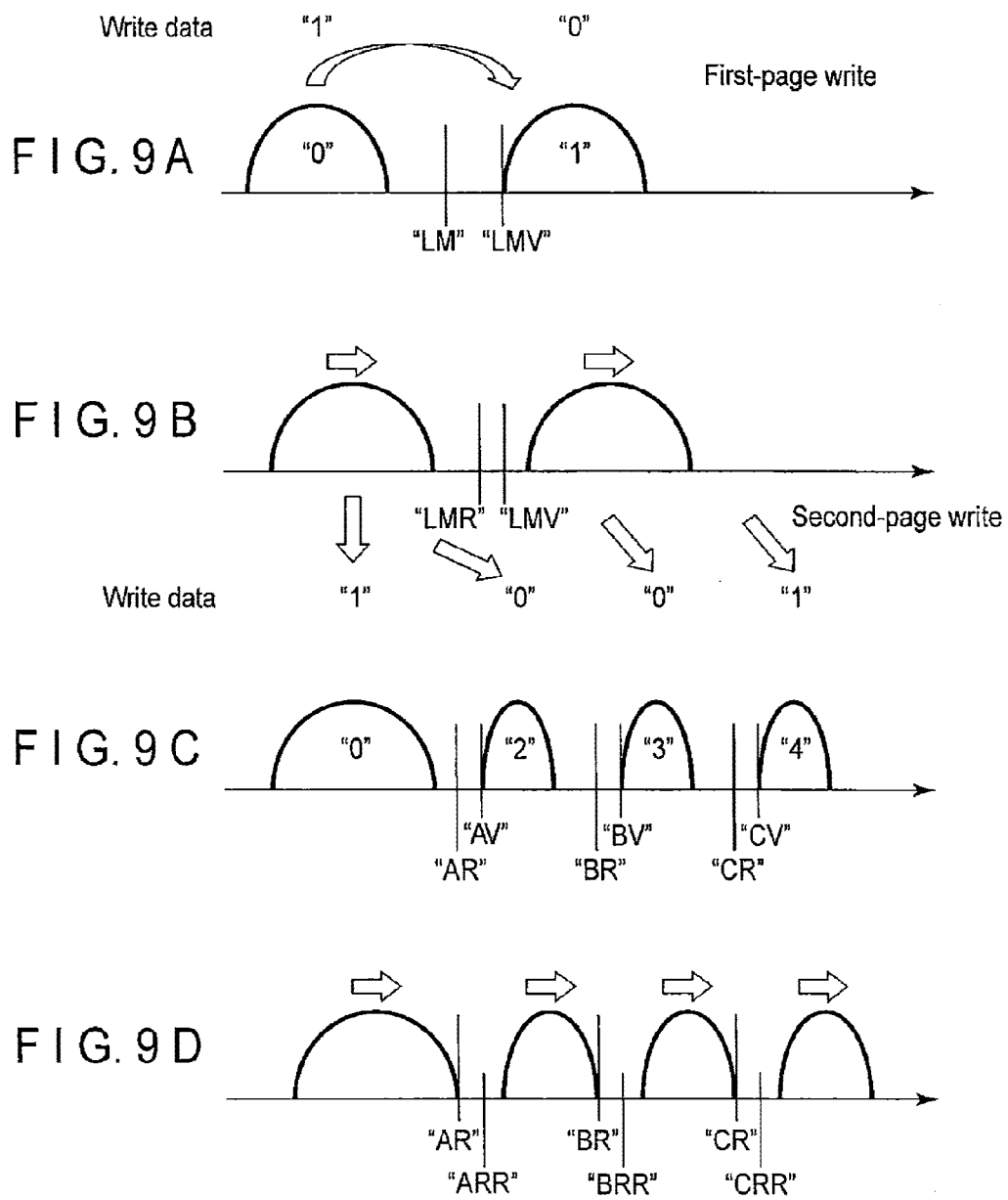

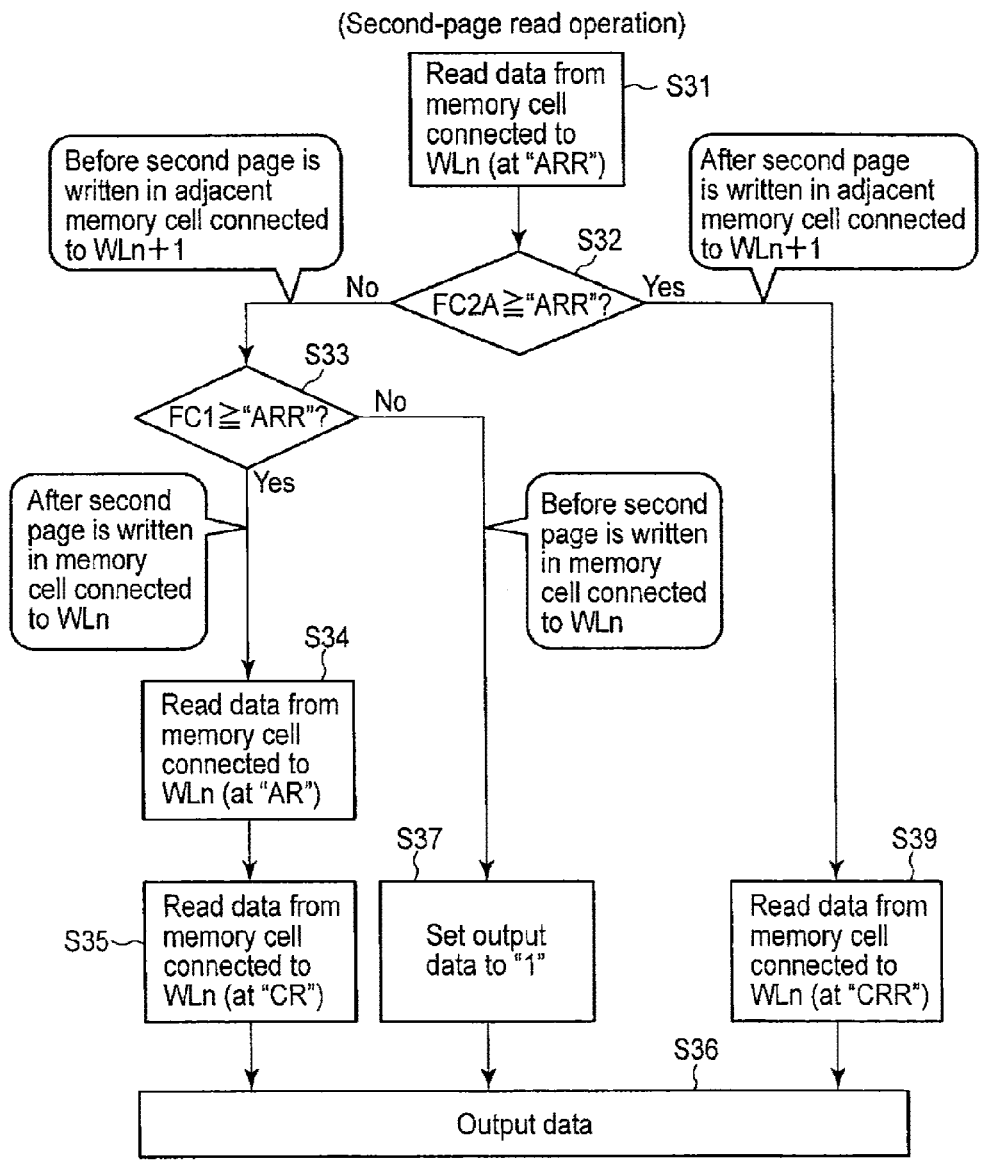
F I G. 20

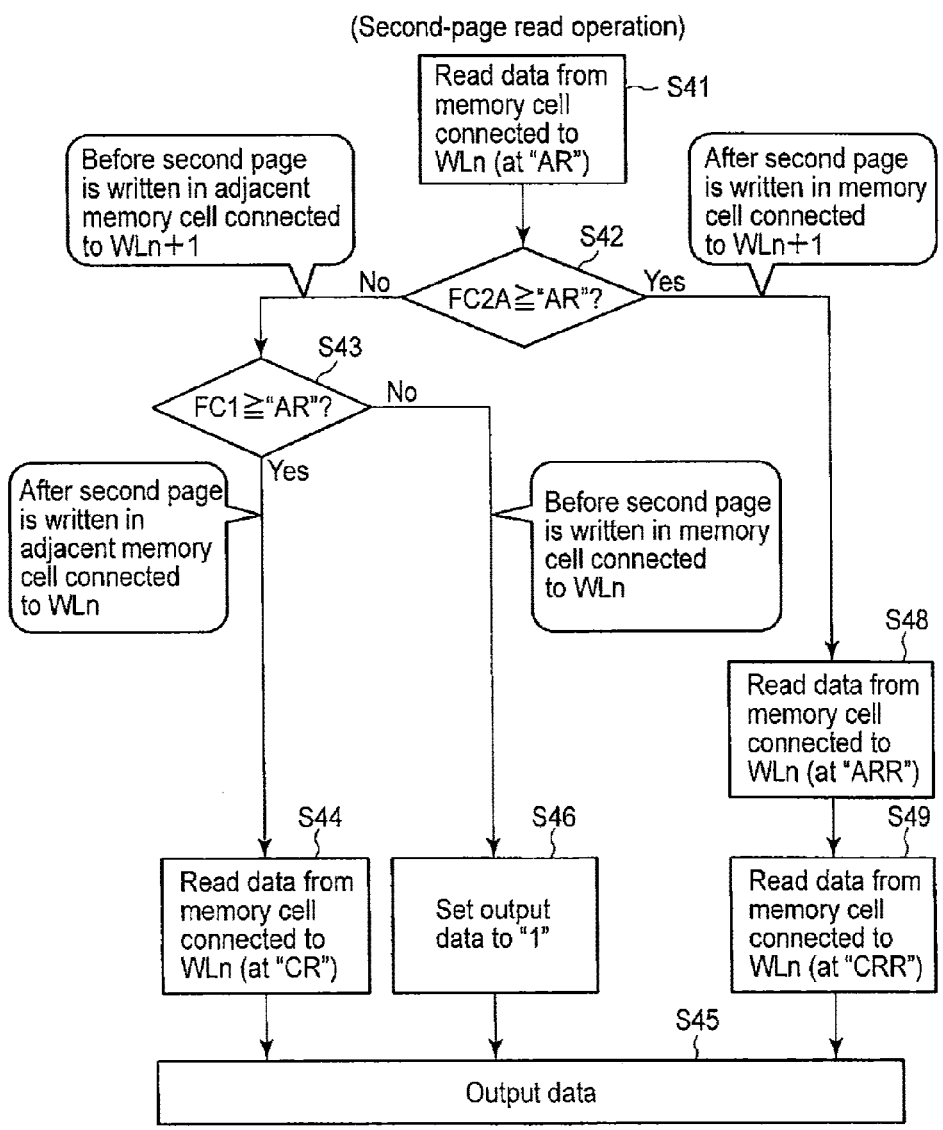
F I G. 22

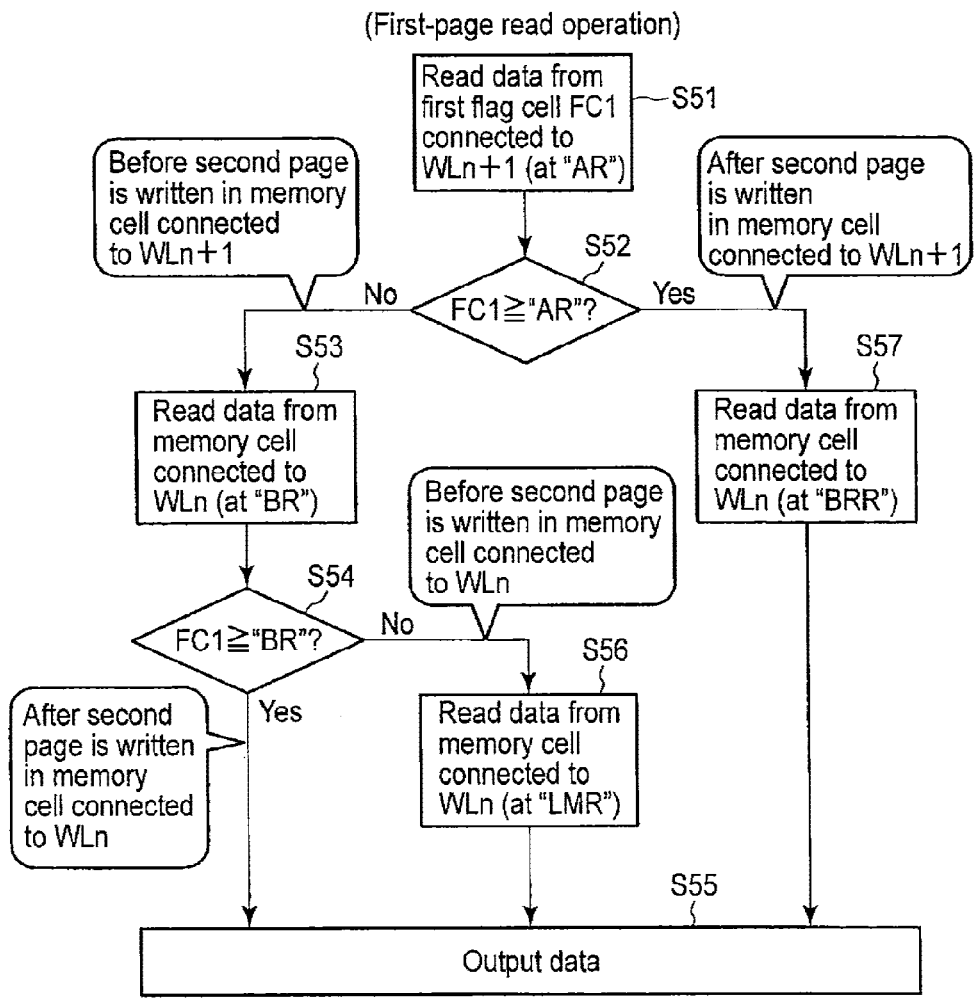
F I G. 24

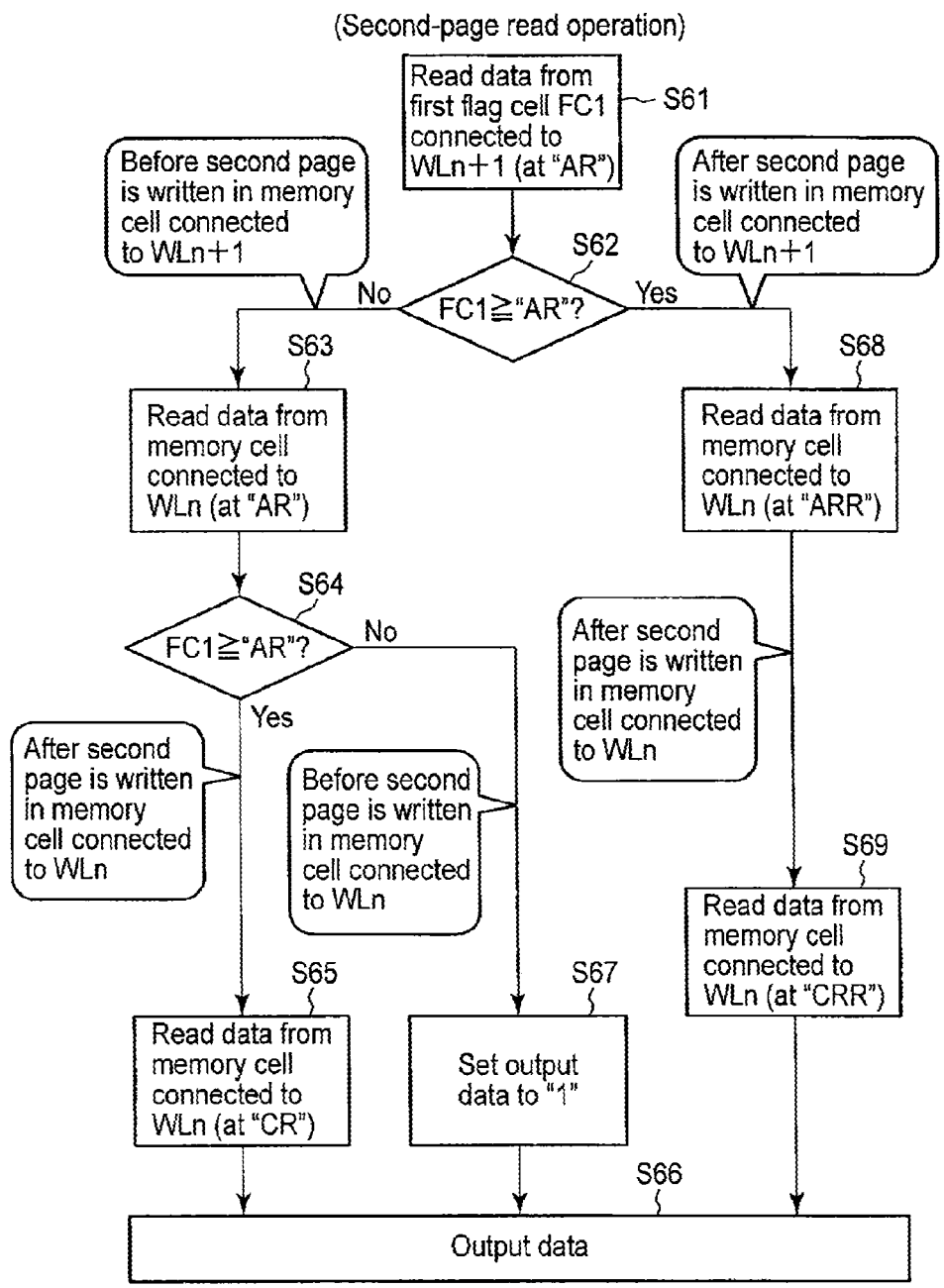
F I G. 26

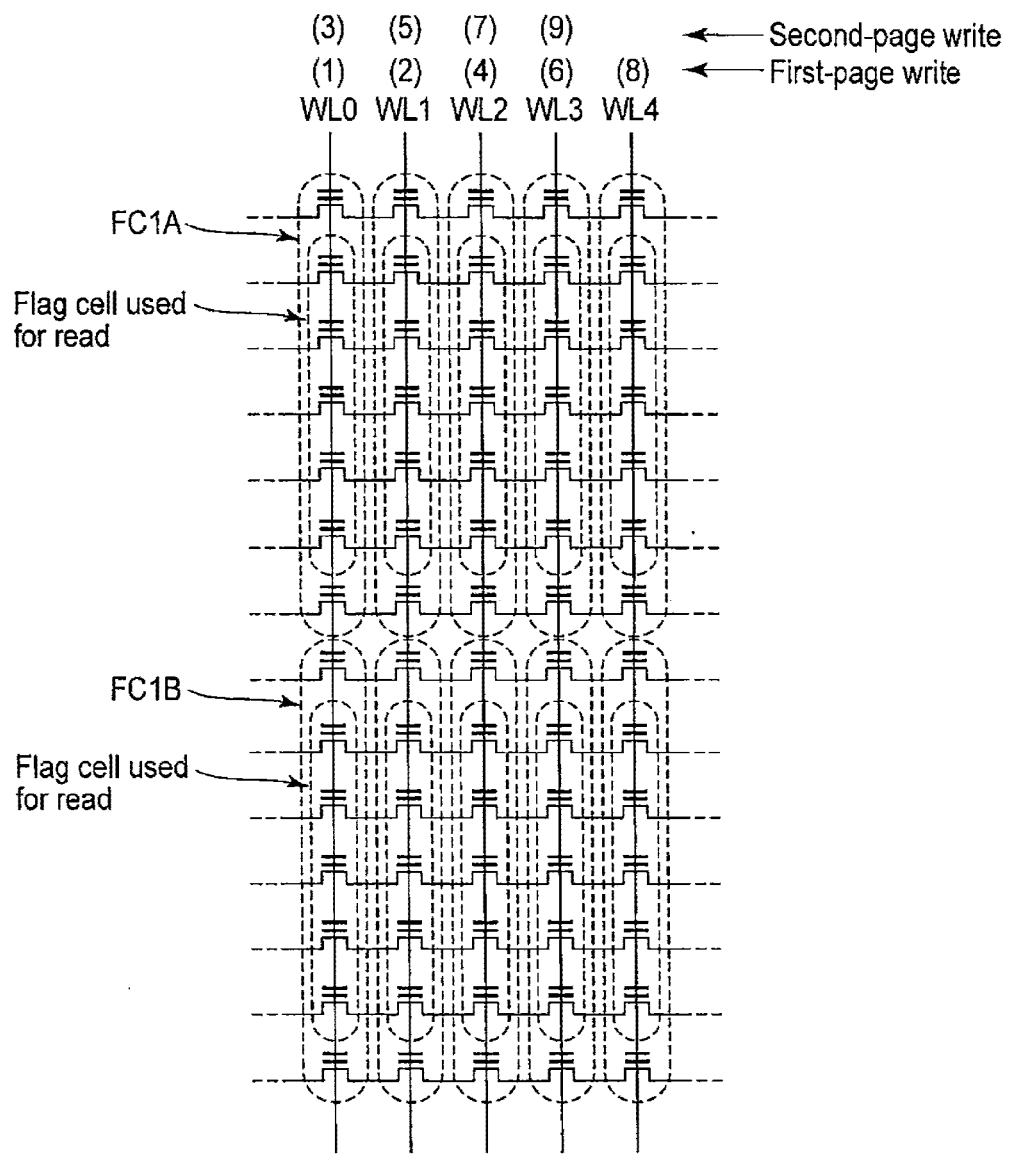
F I G. 29

|  | Number of flag cells | Specified number |
|---|---|---|
| Case 1 | m | m / 2 |
| Case 2 | m | p |

$m \geqq 2, m > p$

F I G. 32

HIGH-SPEED READABLE SEMICONDUCTOR STORAGE DEVICE

CROSS-REFERENCE TO RELATED APPLICATIONS

This application is a continuation of U.S. application Ser. No. 13/599,193 filed Aug. 30, 2012, which is based upon and claims the benefit of priority from Japanese Patent Application No. 2011-264859, filed Dec. 2, 2011, the entire contents of which are incorporated herein by reference.

FIELD

Embodiments described herein relate generally to a semiconductor storage device, such as a NAND flash memory, in which binary or multi-level data can be stored.

BACKGROUND

Recently, there has been developed a multi-level NAND flash memory, in which one of a plurality of threshold voltages is set to one memory cell and data of a plurality of bits are stored.

On the other hand, a coupling capacitance between the memory cells adjacent to each other tends to increase with the shrinking of an element, a threshold voltage of the previously-written memory cell fluctuates according to the write of the adjacent memory cell. Therefore, there is proposed a method for writing a target threshold voltage in the memory cell after the data is written in the adjacent memory cell.

However, when the target threshold voltage is also written in the adjacent memory cell after that, unfortunately the threshold voltage of the memory cell in which the target threshold voltage is written fluctuates due to the coupling capacitance between the memory cells adjacent to each other.

BRIEF DESCRIPTION OF THE DRAWINGS

FIG. 1 is a block diagram schematically showing an example of a NAND flash memory applied to this embodiment;

FIG. 2 is a circuit diagram schematically showing a part of the configuration depicted in FIG. 1;

FIG. 5 is a cross-sectional view showing a NAND flash memory;

FIG. 6 is a view showing an example of voltages supplied to respective regions depicted in FIG. 5;

FIG. 7 is a circuit diagram illustrating part of the data storage circuit in FIGS. 2 and 3, and illustrating a sense amplifier unit;

FIG. 8 is a circuit diagram illustrating part of the data storage circuit in FIGS. 2 and 3, and illustrating a data control unit;

FIGS. 9A, 9B, 9C and 9D are views illustrating a threshold voltage and a read voltage of multi-level data;

FIG. 20 is a flowchart illustrating a second-page read operation according to a first modification of the first embodiment;

FIG. 22 is a flowchart illustrating a second-page read operation according to a third modification of the first embodiment;

FIG. 24 is a flowchart illustrating a first-page read operation according to a modification of the second embodiment;

FIG. 26 is a flowchart illustrating a second-page read operation according to a modification of the second embodiment;

FIG. 29 is a circuit diagram illustrating another example of the flag cell FC1A;

FIG. 32 is an example for determination of threshold voltage of flag cell.

DETAILED DESCRIPTION

Figure 3:
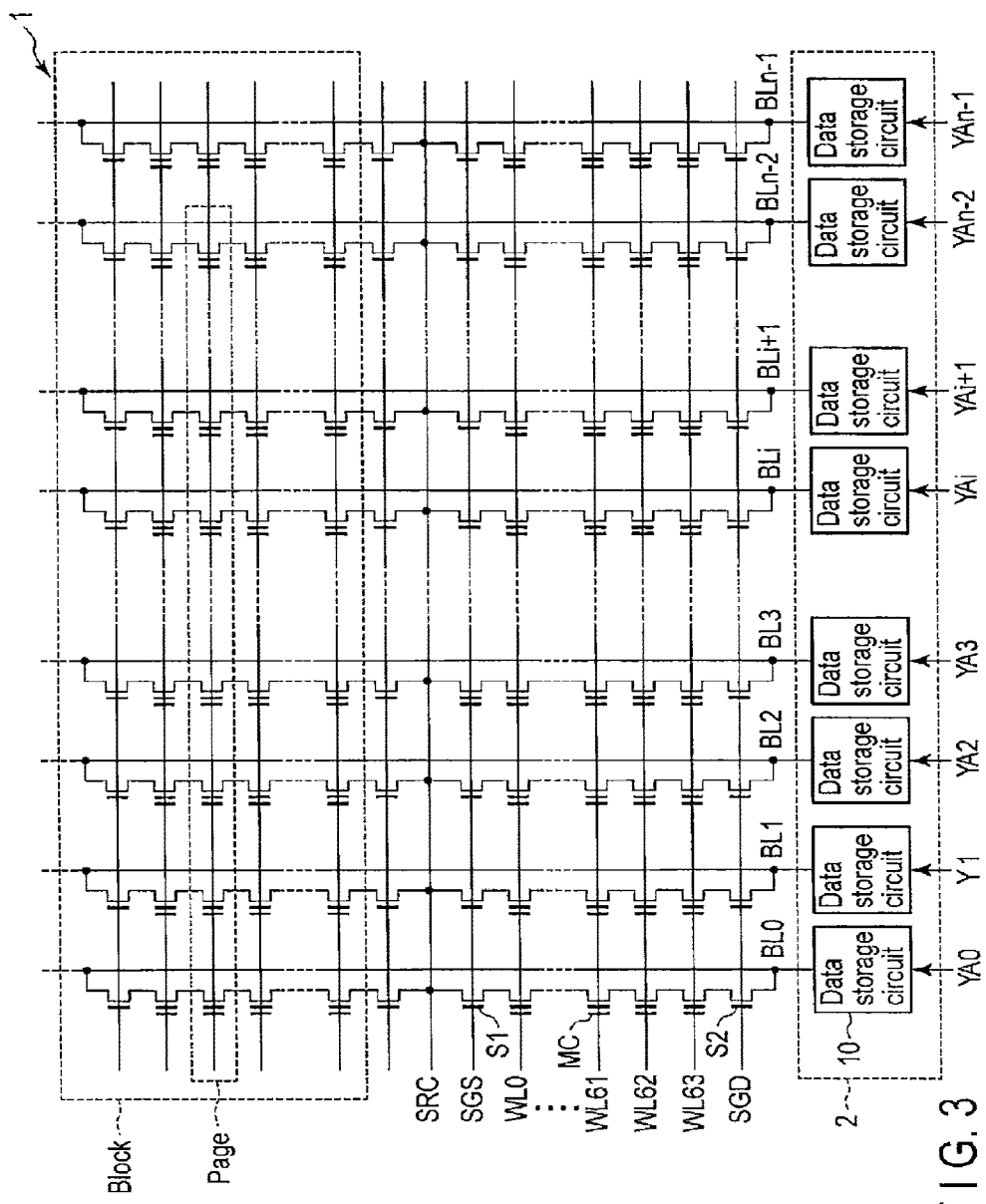
FIG. 3 is a circuit diagram schematically showing a part of the configuration depicted in FIG. 1 as an example different from that in FIG. 2.

In general, according to one embodiment, a semiconductor storage device includes a memory cell array and a controller. The memory cell array includes a first memory cell, a second memory cell, a third memory cell, and a fourth memory cell. The first memory cell and the second memory cell are adjacent to each other, and the third memory cell and the fourth memory cell are adjacent to each other. The first memory cell and the third memory cell are simultaneously selected, the second memory cell and the fourth memory cell are simultaneously selected, and data having k value (k is a natural number of 2 or more) are stored in the first memory cell and the second memory cell. The controller writes the data in the first memory cell, the second memory cell, the third memory cell, and the fourth memory cell of the memory cell array, and reads the data from the first memory cell, the second memory cell, the third memory cell, and the fourth memory cell. After writing data having n value (n is a natural number of 2 or more to k or less) in the first memory cell, the controller writes the data having the n value in the second memory cell and simultaneously writes the fourth memory cell. When reading the data from the first memory cell, the controller reads the data of the third memory cell, which is simultaneously selected together with the first memory cell and the first memory cell. The controller changes a read voltage of the first memory cell based on the data read from the third memory cell.

Hereinafter, embodiments will be described below with reference to the drawings.

FIG. 1 shows an outline configuration of a NAND flash memory that stores, e.g., 2-bit or 4-level data.

A memory cell array 1 includes a plurality of bit lines, a plurality of word lines, and a common source line, and memory cells formed of, e.g., EEPROM cells in which data can be electrically rewritten are arranged in a matrix form. A bit line control circuit 2 configured to control the bit lines and a word line control circuit 6 are connected to this memory cell array 1.

The bit line control circuit 2 reads out data in the memory cells in the memory cell array 1 through the bit lines, detects states of the memory cells in the memory cell array 1 through the bit lines, or applies a write control voltage to the memory cells in the memory cell array 1 through the bit lines to write data into the memory cells. To the bit line control circuit 2 are connected a column decoder 3 and a data input/output buffer 4. A data storage circuit in the bit line control circuit 2 is selected by the column decoder 3. Data in a memory cell read out to the data storage circuit is output to the outside from a data input/output terminal 5 through the data input/output buffer 4. Various kinds of commands CMD that are supplied from the outside and configured to control operations of the NAND flash memory, addresses ADD, and data DT are input to the data input/output terminal 5. The write data input to the data input/output terminal 5 is supplied through the data input/output buffer 4 to the data storage circuit selected by the column decoder 3, and the command and the address are supplied to a control signal and control voltage generating circuit 7 (hereinafter sometimes referred to as a "control circuit").

The word line control circuit 6 is connected to the memory cell array 1. This word line control circuit 6 selects a word line in the memory cell array 1 and applies a voltage required for a read, write, or erase operation to the selected word line.

The memory cell array 1, the bit line control circuit 2, the column decoder 3, the data input/output buffer 4, and the word line control circuit 6 are connected to the control signal and control voltage generation circuit 7 and controlled by this control signal and control voltage generation circuit 7. The control signal and control voltage generating circuit 7 is connected to a control signal input terminal 8, and controlled by control signals ALE (Address Latch Enable), CLE (Command Latch Enable), WE (Write Enable), and RE (Read Enable) that are input from an external HM (such as a memory controller or a host) through the control signal input terminal 8.

The bit line control circuit 2, the column decoder 3, the word line control circuit 6, and the control signal and control voltage generation circuit 7 constitute a write circuit and a read circuit.

FIG. 2 shows an example of configurations the memory cell array 1 and the bit line control circuit 2 depicted in FIG. 1. A plurality of NAND strings are disposed in the memory cell array 1. Each NAND string includes a memory cell MC, which is constructed by, for example, series-connected 64 EEPROMs, and selection gates S1 and S2. The selection gate S2 is connected to a bit line BL0e, and the selection gate S1 is connected to a source line SRC. A control gate of the memory cell MC disposed in each row is commonly connected to word lines WL0 to WL61, WL62, and WL63. Further, the selection gates S2 are connected to a select line SGD in common, and the selection gates S1 are connected to a select line SGS in common.

The bit line control circuit 2 has a plurality of data storage circuits 10. The data storage circuits 10 are connected to pairs of bit lines (BL0e, BL0o), (BL1e, BL1o), ..., (Blie, BLio), and (BLne, BLno), respectively.

As indicated by a broken line, the memory cell array 1 includes a plurality of blocks. Each block is constituted of the plurality of NAND cells, and data is erased in, e.g., blocks. Furthermore, an erase operation is carried out with respect to two bit lines connected to the data storage circuit 10 at the same time.

A plurality of memory cells (memory cells in a range surrounded by broken lines), which are disposed every other bit line and connected to one word line, constitute one sector (sometimes also referred to as "one page"). Data is written or read in accordance with each sector. That is, a half of the plurality of memory cells arranged in the row direction are connected to corresponding bit lines. Therefore, the write or read operation is executed with respect to the half of the plurality of memory cells arranged in the row direction.

During a read operation, a program verify operation, and program operation, one bit line is selected from two bit lines (Blie, BLio) connected to the data storage circuit 10 according to an address signal (YA0, YA1, ..., YAi, ..., YAn) that is supplied from the outside. Additionally, one word line is selected in accordance with an external address, and two pages indicated by a broken line are selected. Switching of the two pages is carried out by using an address.

FIG. 3 shows another example of the configurations of the memory cell array 1 and the bit line control circuit 2 depicted in FIG. 1. In the configurations shown in FIG. 2, the two bit lines (BLie, BLio) are connected to the data storage circuit 10. On the other hand, for the configuration in FIG. 3, the data storage circuit 10 is connected to each bit line. All the memory cells disposed in a row direction are connected to the corresponding bit lines. Therefore, the write or read operation can be carried out with respect to all the memory cells arranged in the row direction.

In FIGS. 2 and 3, the memory cell array 1 includes a plurality of flag cells.

Although the following description holds true for both the configuration in FIG. 2 and the configuration in FIG. 3, the case that the configuration in FIG. 3 is used will be described.

Figure 4A:
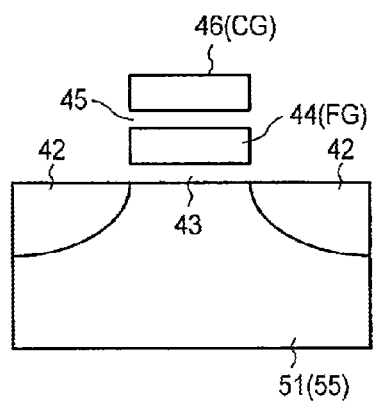
FIGS. 4A and 4B are cross-sectional views showing a memory cell and a selection transistor.
Figure 4B:
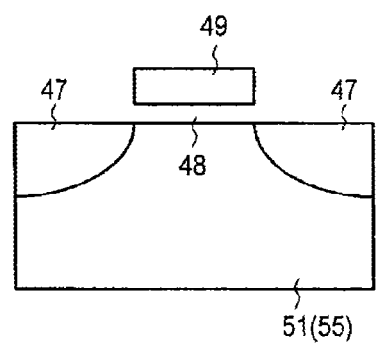

FIGS. 4A and 4B are cross-sectional views of a memory cell and a selection transistor. FIG. 4A shows the memory cell. Respective n-type diffusion layers 42 as a source and a drain of the memory cell are formed in a substrate 51 (a later-described P-type well region 55). A floating gate (FG) 44 is formed on a P-type well region 55 with a gate insulator 43 interposed therebetween, and a control gate (CG) 46 is formed on the floating gate 44 with an insulating film 45 interposed therebetween. FIG. 4B shows the selection gate. Respective n-type diffusion layers 47 as a source and a drain are formed in the P-type well region 55. A control gate 49 is formed above the P-type well region 55 through a gate insulating film 48.

FIG. 5 is a cross-sectional view of a NAND flash memory. For example, N-type well regions 52, 53, and 54 and a P-type well region 56 are formed in a P-type semiconductor substrate 51. A P-type well region 55 is formed in the N-type well region 52, and a memory cell Tr constituting the memory cell array 1 is formed in this P-type well region 55. A low-voltage P-channel transistor LVPTr and a low-voltage N-channel transistor LVNTr, which constitute the data storage circuit 10, are formed in the N-type well region 53 and the P-type well region 56, respectively. A high-voltage N-channel transistor HVNTr that connects the bit line and the data storage circuit 10 is formed in the substrate 51. A high-voltage P-channel transistor HVPTr that constitutes, for example, the word-line control circuit is formed in the N-type well region 54. As shown in FIG. 5, each of the high-voltage transistors HVNTr and HVPTr has, e.g., a gate insulation film thicker than each of the low-voltage transistors LVNTr and LVPTr.

FIG. 6 shows an example of voltages supplied to the respective regions shown in FIG. 5. In the erase, program, and read operations, such voltages as depicted in FIG. 6 are supplied to the respective regions. In FIG. 6, the sign Vera designates a voltage applied to the substrate in erasing the data, the sign Vss designates a ground voltage, and the sign Vdd designates a power-supply voltage. The sign Vpgmh designates a voltage, which is supplied to a transistor gate of a row decoder that transfers a voltage Vpgm supplied to the word line in writing the data, and the voltage Vpgmh is greater than or equal to Vpgm+Vt (a threshold voltage of the transfer transistor).

The sign Vreadh designates a voltage, which is supplied to the transistor gate of the row decoder that transfers a voltage Vread supplied to the word line in reading the data, and the voltage Vreadh is greater than or equal to Vread+Vt (the threshold voltage of the transfer transistor).

FIGS. 7 and 8 illustrate an example of the data storage circuit 10 in FIGS. 2 and 3. The data storage circuit 10 includes a sense amplifier unit (SAU) 10a in FIG. 7 and a data control unit (DCU) 10b in FIG. 8.

Referring to FIG. 7, the sense amplifier unit 10a includes a plurality of N-channel MOS transistors (hereinafter referred to as NMOSs) 21 to 27, a plurality of P-channel MOS transistors (hereinafter referred to as PMOSs) 28 and 29, transfer gates 30 and 31, a latch circuit 32, and a capacitor 33. For example, the latch circuit 32 includes clocked inverter circuits 32a and 32b.

One end of a current passage of the NMOS 21 is connected to a node to which a power supply Vdd is supplied, and the other end is grounded through the transfer gate 30, the NMOS 24, and the transfer gate 31. One end of the current passage of the NMOS 25 is connected to a connection node of the NMOS 24 and the transfer gate 31. The other end of the NMOS 25 is connected to the bit line BL disposed in the memory cell array. A series circuit of the NMOSs 22 and 23 is connected to NMOS 21 in parallel.

One end of the current passage of the PMOS 28 is connected to the node to which the power supply Vdd is supplied, and the other end is grounded through the NMOS 26 while connected through the PMOS 29 to an input end of the inverter circuit 32a constituting the latch circuit 32. An input end of the clocked inverter circuit 32b, which is cross-connected to the inverter circuit 32a, is connected to the data control unit (DCU) 10b through the NMOS 27. A gate of the PMOS 29 is connected to a connection node of NMOSs 22 and 23, and one end of the capacitor 33 is connected to the connection node. A clock signal CLK is supplied to the other end of the capacitor 33.

A signal BLX is supplied to a gate of the NMOS 21. A signal LAT at an output end of the inverter circuit 32a constituting the latch circuit 32 is supplied to a gate of an NMOS constituting the transfer gate 30, and a signal INV at an input end of the inverter circuit 32a is supplied to a gate of a PMOS constituting the transfer gate 30. A signal BLC is supplied to a gate of the NMOS 24, and a signal BLS is supplied to a gate of the NMOS 25. The signal INV at the input end of the inverter circuit 32a constituting the latch circuit 32 is supplied to a gate of an NMOS constituting the transfer gate 31, and the signal LAT at the output end of the inverter circuit 32a is supplied to a gate of a PMOS constituting the transfer gate 31.

A signal HLL is supplied to a gate of the NMOS 22, and a signal XXL is supplied to a gate of the NMOS 23.

A signal STB is supplied to a gate of the PMOS 28, and a reset signal RST is supplied to a gate of the NMOS 26. A signal NOC is supplied to a gate of the NMOS 27.

An operation of the sense amplifier unit will schematically be described.

(Write Operation)

When the data is written in the memory cell, the signal STB is set to a high level (hereinafter referred to as an H-level), the reset signal RST is set temporarily to the H-level to reset the latch circuit 32, the signal LAT is set to the H-level, and the signal INV is set to a low level (hereinafter referred to as an L-level).

Then the signal NCO is set to the H-level to take in the data from the data control unit 10b. In the case that the data is the L-level ("0") indicating the write, the signal LAT is set to the L-level, and the signal INV is set to the H-level. In the case that the data is the H-level ("1") indicating non-write, the data of the latch circuit 32 is not changed, the signal LAT is retained in the H-level, and the signal INV is retained in the L-level.

Then the signals BLX, BLC, and BLS are set to the H-level. In the case that the signal LAT of the latch circuit is set to the L-level while the signal INV is set to the H-level (write), the transfer gate 30 is turned off, the transfer gate 31 is turned on, and therefore the bit line BL becomes the ground voltage Vss. At this point, the data is written in the memory cell when the word line becomes the program voltage Vpgm.

On the other hand, in the case that, in the latch circuit 32, the signal LAT is set to the H-level while the signal INV is set to the L-level (non-write), the transfer gate 30 is on, and the transfer gate 31 is off, whereby the bit line BL is charged to the power-supply voltage Vdd. Therefore, when the word line becomes the voltage Vpgm, the data is not written in the memory cell because a channel of the memory cell is boosted to a high potential.

(Read Operation and Program Verify Read Operation)

In the case that the data is read from the memory cell, the reset signal RST is temporarily set to the H-level to reset the latch circuit 32, and the signal LAT is set to the H-level, and the signal INV is set to the L-level. Then the signals BLS, BLC, BLX, HLL, and XXL are set to predetermined voltages to charge the bit line BL. At the same time, Node of the capacitor 33 is charged to the power-supply voltage Vdd. In the case that the threshold voltage of the memory cell is higher than the read voltage, the memory cell is in an off state and the bit line BL is retained in the H-level. That is, Node is retained in the H-level. In the case that the threshold voltage of the memory cell is lower than the read voltage, the memory cell is in an on state, and the charge of the bit line BL is discharged. Therefore, the bit line BL becomes the L-level, and Node becomes the L-level.

Then the signal STB is set to the L-level. In the case that the memory cell is on, because Node is at the L-level, the PMOS 29 is turned on to set the signal INV of the latch circuit 32 to the H-level, and the signal LAT becomes the L-level. On the other hand, in the case that the memory cell is off, the signal INV of the latch circuit 32 is retained in the L-level, and the signal LAT is retained in the H-level.

Then, the signal NCO is set to the H-level, the NMOS 27 is turned on, and the data of the latch circuit 32 is transferred to the data control unit 10b.

The program verify operation to verify the threshold voltage of the memory cell after the write operation is substantially identical to the above read operation.

FIG. 8 illustrates an example of the data control unit (DCU) 10b.

The data control unit 10b in FIG. 8 includes an operational circuit 40, a plurality of data latch circuits ADL, BDL, and XDL, and an NMOS 41.

The operational circuit 40 includes a bus (hereinafter referred to as an IBUS), transfer gates 42 and 43 that are connected to both ends of the IBUS to operate complementarily, a latch circuit 44 that latches the data of the IBUS, and a setting circuit 45 that sets levels of the data latch circuits ADL, BDL, and XDL according to the data of the latch circuit 44.

The transfer gate 42 operates by complementary signal COND and signal CONS to connect a bus (hereinafter referred to as an SBUS) of the sense amplifier unit SAU 10a and the IBUS. The transfer gate 43 operates by the complementary signal CONS and signal COND to connect the IBUS and a bus (hereinafter referred to as a DBUS) to which the data latch circuits ADL, BDL, and XDL are connected. The transfer gate 43 is off when the transfer gate 42 is on, and the transfer gate 43 is on when the transfer gate 42 is off.

The latch circuit 44 includes a plurality of PMOSs 46 to 49, a plurality of NMOSs 50 to 56, and an inverter circuit 68. A set signal SET is supplied to gates of the PMOS 46 and the NMOS 50, and a reset signal REST is supplied to a gate of the PMOS 48. A signal IFH is supplied to a gate of the NMOS 53, and a signal IFL is supplied to a gate of the NMOS 55. The IBUS is connected to a gate of the NMOS 54 through the inverter circuit 68, and a gate of the NMOS 56 is connected to the IBUS.

The setting circuit 45 includes PMOSs 57 to 60 and NMOSs 61 to 64. A signal FAIL is supplied to gates of the PMOS 57 and the NMOS 61. The signal FAIL is a signal at a connection node of the PMOS 47 and the NMOS 51 as one of output ends of the latch circuit 44. A signal MTCH is supplied to gates of the PMOS 59 and the NMOS 63. The signal MTCH is a signal at a connection node of the PMOS 49 and the NMOS 52 as the other output end of the latch circuit 44. A signal M2HB is supplied to a gate of the PMOS 58, and a signal F2HB is supplied to a gate of the PMOS 60. A signal F2L is supplied to a gate of the NMOS 62, and a signal M2L is supplied to a gate of the NMOS 64.

The data latch circuits ADL, BDL, and XDL have an identical configuration, and each of the data latch circuits ADL, BDL, and XDL includes a latch circuit 66 and a transfer gate 65 that connects the latch circuit 66 to the DBUS. The transfer gates 65 are controlled by signals BLCA, BLCB, and BLCX and their inverting signals BLCA_B, BLCB_B, and BLCX_B, respectively. The data latch circuit XDL is connected to an external IO through the NMOS 41. A signal CSL is supplied to a gate of the NMOS 41.

As described above, the data control unit 10b retains the write data, and retains the data read from the memory cell during the read operation.

For example, the data latch circuits ADL and BDL latch the two-bit write data, which is supplied from the data input/output buffer 6, one bit by one bit through the data latch circuit XDL.

The operational circuit 40 in FIG. 8 can perform operations, such as AND, OR, and exclusive NOR, to the data latch circuits ADL and BDL. For example, for the AND operation, data retained by the data latch circuits ADL and BDL are output to the DBUS and the IBUS. The IBUS becomes the H-level only in the case that both data retained by the data latch circuits ADL and BDL are "1", and the IBUS becomes the L-level in other cases. That is, the IBUS becomes "1" only in the non-write operation, and the IBUS becomes "0" in the write operation. The data is transferred through the SBUS to the sense amplifier unit 10a in FIG. 7, thereby performing the write operation.

Each one operational circuit 40 in FIG. 8 can also be disposed with respect to the plurality of sense amplifier units (SAU) 10a in FIG. 7 and the plurality of data control units (DCU) 10b in FIG. 8. Therefore, a circuit area can be reduced.

Various modifications can be made for the operation of the operational circuit 40. For example, various control methods may be adopted for one logical operation, and the control method may be changed as needed bases.

In the embodiment, the data latch circuit is constructed by ADL, BDL, and XDL. The XDL may be eliminated when a write cache to which the next data is input is not required during the write operation.

One data latch may be eliminated when the binary data is stored. A chip size can be reduced by eliminating the data latch.

Because the NAND flash memory of the embodiment is the multi-level memory, the two-bit data can be stored in one memory cell. The two bits are switched by an address (first page and second page). The two pages are necessary in the case that the two bits are stored in one memory cell, and each bit is switched by the address (first page, second page, and third page) in the case that three bits are stored in one memory cell. The bit is switched by the address (first page, second page, third page, and fourth page) in the case that four bits are stored in one memory cell.

(Write Operation and Read Operation)

An operation to collectively perform the read operation or write operation to all the memory cells (units of pages) arrayed in the row direction will be described below by taking four-level data as an example. At this point, the threshold voltages of the memory cell are set according to the data having the four values.

As illustrated in FIGS. 3, 8, and 10, the data for one page is supplied from the outside, and stored in the latch circuit XDL of each data storage circuit. Then the data is written in selected one word line. The plurality of word lines in one block are sequentially selected from the word line WL0 on the source side, and the data is written in the memory cell connected to the selected word line.

FIGS. 9A to 9D and FIGS. 10A and 10B illustrate a write sequence.

Figure 10A:
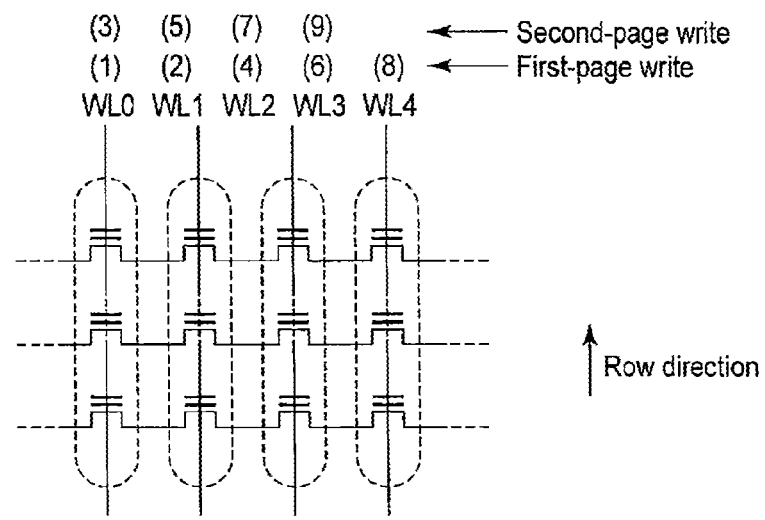
FIG. 10A is a circuit diagram illustrating part of a cell array.
Figure 10B:
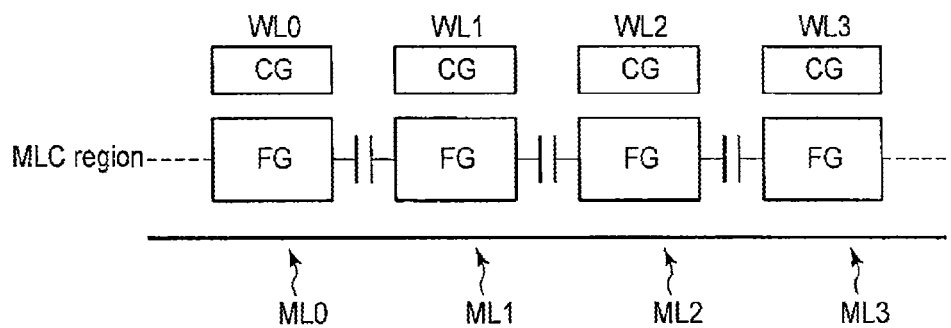
FIG. 10B is a configuration diagram illustrating part of the cell array.

As illustrated in FIGS. 10A and 10B, for example, the data is written in the following sequence.

(1) The first page of the word line WL0
(2) The first page of the word line WL1
(3) The second page of the word line WL0
(4) The first page of the word line WL2
(5) The second page of the word line WL1
(6) The first page of the word line WL3
(7) . . .

As illustrated in FIG. 9A, the data of the memory cell in the erase state has the threshold voltage "0", and becomes the threshold voltage "1" by writing the data "0" in the first page. In FIG. 9A, the sign "LMV" designates a verify voltage of the data "1".

When the data is written in the adjacent memory cell, the threshold voltage of the memory cell is slightly raised relative to the verify voltage "LMV" by the coupling capacitance between the floating gates as illustrated in FIG. 9B. The verify voltage "LMV" is set slightly higher than a read voltage "LMR" because a data retention margin is provided.

Then, the data "0" or "1" is written in the second page, whereby the data of the memory cell becomes "0", "2", "3", and "4" as illustrated in FIG. 9C. That is, the data is left in "0" in the case that the first-page data is "1" while the second-page data is "1", and the data becomes "2" in the case that the first-page data is "1" while the second-page data is "0". The data becomes "3" in the case that the first-page data is "0" while the second-page data is "1", and the data becomes "4" in the case that the first-page data is "0" while the second-page data is "0".

During the write operation, verify voltages AV, BV, and CV are set as illustrated in FIG. 9C. Because the data retention margin is provided, the verify voltages AV, BV, and CV are slightly higher than read voltages AR, BR, and CR.

As illustrated in FIG. 9D, when the data is written in the adjacent memory cell, the threshold voltages of the memory cell are raised higher than the verify voltages AV, BV, and CV due to the coupling capacitance between the floating gates. In this case, the data can securely be read at read voltages ARR, BRR, and CRR that are slightly higher than the read voltages AR, BR, and CR.

Therefore, each word line includes a second flag cell to determine whether the second-page data is written, and a boosting cell PC is disposed such that the threshold of the second flag cell fluctuates when the second-page data of the adjacent memory cell is written.

First Embodiment

Figure 11:
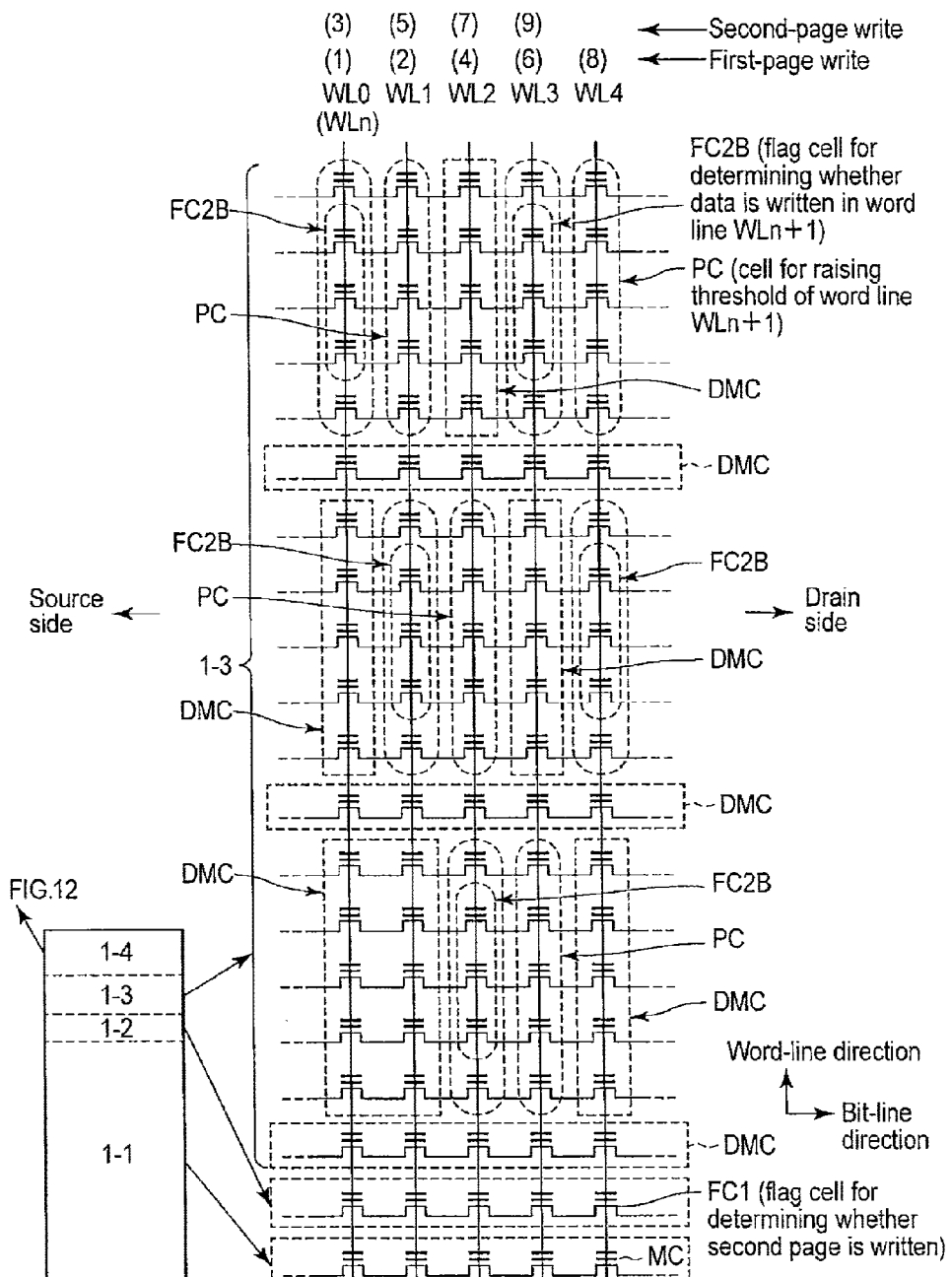
FIG. 11 is a circuit diagram illustrating part of a memory cell array 1 according to a first embodiment.
Figure 12:
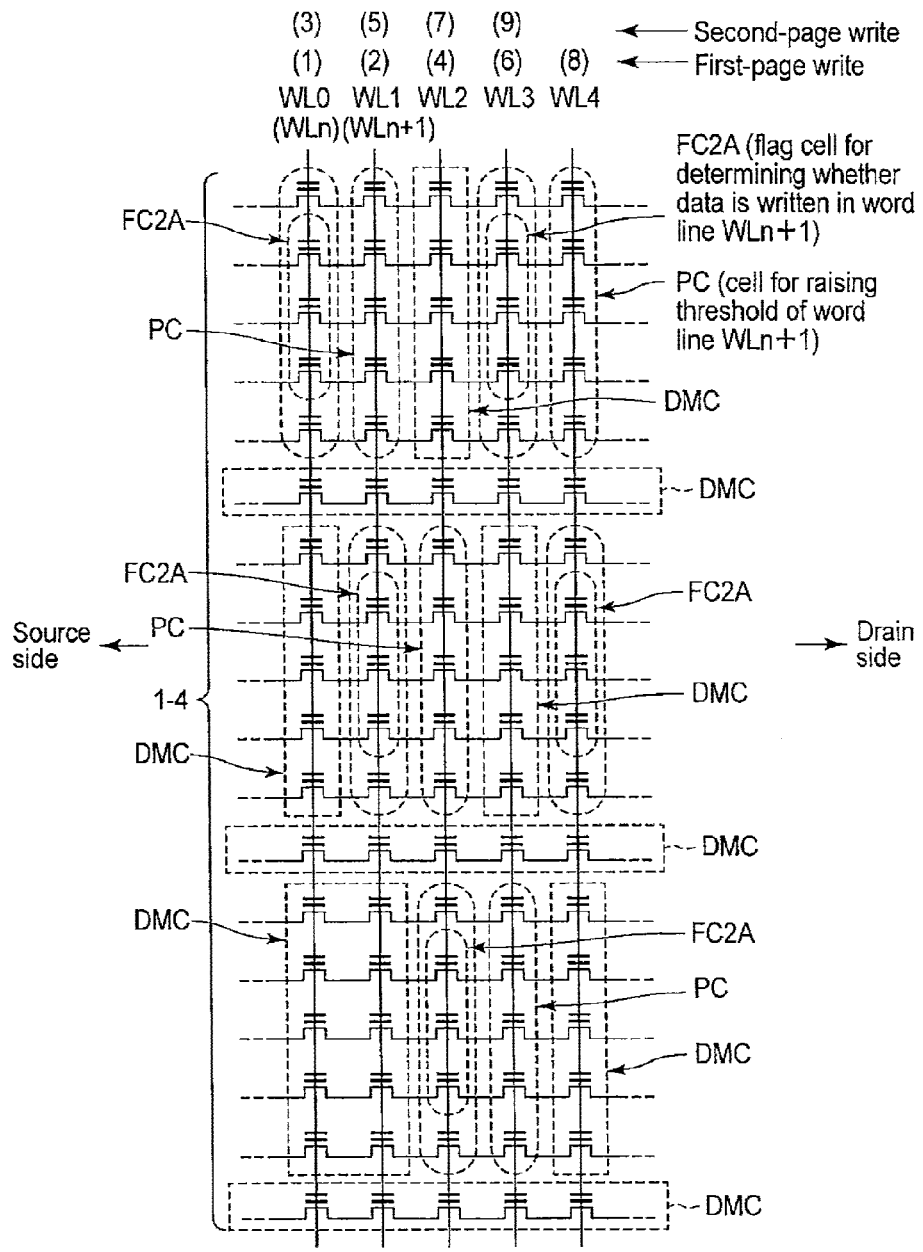
FIG. 12 is a circuit diagram illustrating part of the memory cell array 1 of the first embodiment.

FIGS. 11 and 12 illustrate a first embodiment.

As described above, the memory cell array 1 includes a plurality of flag cells. FIGS. 11 and 12 illustrate part of the memory cell array 1.

Referring to FIGS. 11 and 12, the memory cell array 1 includes a data region 1-1 in which the data is stored, a first flag region 1-2 that determines whether the second-page data is written in the memory cell of the data region 1-1, and second flag regions 1-3 and 1-4 that determine whether the data is written in the adjacent memory cell. The second flag regions 1-3 and 1-4 have the identical configuration except that a threshold voltage set to a second flag cell FC2B differs from that of a second flag cell FC2A.

In FIGS. 11 and 12, the word lines WL0, WL1, . . . , and WL4 are disposed from the source side of the memory cell toward the drain side, and the write operation is sequentially performed from the memory cell on the source side.

In the first flag region 1-2 in FIG. 11, a first flag cell FC1 is disposed in each of the word lines WL0, WL1, . . . , and WL4. The write operation is performed to the first flag cell FC1 at a given threshold voltage at the same time as the second-page data is stored in the memory cell of the data region 1-1.

FIG. 11 illustrates the case that one first flag cell FC1 is connected to one word line. However, the number of first flag cells FC1 is not limited to one. For example, the plurality of first flag cells FC1 are connected to one word line WL, and whether the second-page data is stored can be determined by a majority vote of data stored in the first flag cells FC1 (FIG. 32 Case 1). In case the number of the first flag cells FC1 is even, and when a result of majority vote is draw, it can be determined whether the second-page data is written or not in advance. For example, it may be determined the second-page data has been stored when the result of majority vote is draw. Alternatively, whether the second-page data is stored can be determined when the number of predetermined data (for example, data "3") stored in the plurality of first flag cells FC1 is greater than or equal to a specified number (FIG. 32 Case 2).

Hereinafter, "the threshold voltage of the first flag cell is high or low" includes the case that whether "the threshold voltage is high or low" is determined based on a result of the majority vote of data. As illustrated in FIG. 29, two kinds of first flag cells FC1A and FC1B connected to the identical word line WL can be provided in the first flag cell FC1. The second-page data is written in the first flag cell FC1A at the threshold level of the data "2", and the second-page data is written in the first flag cell FC1B at the threshold level of the data "3". At this point, each of the first flag cells FC1A and FC1B may include a plurality of flag cells. In this case, whether the second-page data is stored can be determined by the majority vote of data written in the plurality of first flag cells FC1A and the plurality of first flag cells FC1B.

Whether the second-page data is stored can be determined when the numbers of predetermined data (for example, the first flag cell FC1A is the data "2", and the first flag cell FC1B is the data "3") stored in the plurality of first flag cells FC1A and the plurality of first flag cells FC1B are greater than or equal to specified numbers.

In the word line WLn, the second-page data is written in all the plurality of first flag cells FC1A and all the plurality of first flag cells FC1B. On the other hand, during the read operation, it is also possible that data stored in the first flag cell FC1A and the flag cells at both ends of the plurality of first flag cells FC1B are not used in the majority vote of data. As a result, read error caused by the influence of the memory cell adjacent in a word-line direction can be prevented. The write operation is not performed to the first flag cell FC1A and the flag cells at both ends of the plurality of first flag cells FC1B, but the first flag cell FC1A and the flag cells can be dealt with as a dummy cell.

Sometimes the first flag cells FC1A and FC1B are simply referred to as a "first flag cell FC1" unless otherwise noted. In the case that the two kinds of the first flag cells (first flag cells FC1A and FC1B) are not provided, for example, the first flag cell becomes only the first flag cell FC1B in FIG. 29.

In the second flag region 1-3, the second flag cell FC2B is disposed in each word line in order to determine whether the data is written in the memory cell of, for example, a word line WLn+1. The second flag cell FC2B is disposed so as to deviates in the bit-line direction in each word line WL. In other words, the second flag cell FC2B disposed in a word line WLn is not adjacent to the second flag cells FC2B disposed in word lines WLn−1 and WLn+1 in the bit-line direction. In the first embodiment, the case that three second flag cells FC2B are connected to each word line WL will be described by way of example. Whether the data is written in the adjacent memory cell is determined by determining the threshold voltages of the three second flag cells FC2B. Specifically, whether each of the threshold voltages of the three second flag cells FC2B is greater than or equal to a given voltage is determined. Then the control circuit 7 determines whether the threshold voltage of the second flag cell FC2B is greater than or equal to the given voltage through the read operation. As a result, for example, the control circuit 7 determines whether two (as a specific value) or more second flag cells FC2B exceeds a given threshold voltage, thereby determining whether the data is written in the adjacent memory cell.

In the second flag region 1-3, the boosting cell PC that raises the threshold voltage of the second flag cell FC2B using the coupling capacitance between the floating gates is disposed in each word line while being adjacent onto the drain side of the second flag cell FC2B. The boosting cell PC is also disposed obliquely adjacent onto the drain side of the second flag cell FC2B. In the first embodiment, for example, five boosting cells PC are disposed with respect to the three second flag cells FC2B, and two of the five boosting cells PC are disposed in both sides of the bit-line direction of the second flag cell FC2B.

The memory cells are two-dimensionally arrayed in order to reduce the memory cell. Therefore, preferably the second flag cells FC2B and the boosting cells PC are also two-dimensionally arrayed. That is, the memory cell adjacent to the bit-line direction of the three second flag cells FC2B is dealt with as the dummy cell.

The threshold voltage of the second flag cell FC2B is raised by writing the data in the memory cell connected to the word line adjacent on the drain side. That is, the threshold voltage of the second flag cell FC2B fluctuates by the raises of the threshold voltages of the two obliquely adjacent second flag cells FC2B in the three second flag cells FC2B. The five boosting cells PC can be disposed with respect to the second flag cells FC2B in order to more largely raise the threshold voltages of the second flag cells FC2B.

Specifically, for example, the five boosting cells PC are disposed in the word line WL1 with respect to the three second flag cells FC2B disposed in the word line WL0. The five boosting cells PC are disposed in the word line WL2 with respect to the three second flag cells FC2B disposed in the word line WL1. The five boosting cells PC are disposed in the word line WL3 with respect to the three second flag cells FC2B disposed in the word line WL2. Thus, the configuration of the three second flag cells FC2B and the five boosting cells PC (sometimes referred to as a "flag boosting cell group") are repeatedly disposed. The number of flag cells FC2B is not limited to three but may be four or more. The number of boosting cells PC may be identical to that of flag cells FC2B, or be greater than that of flag cells FC2B by at least two.

Figure 30:
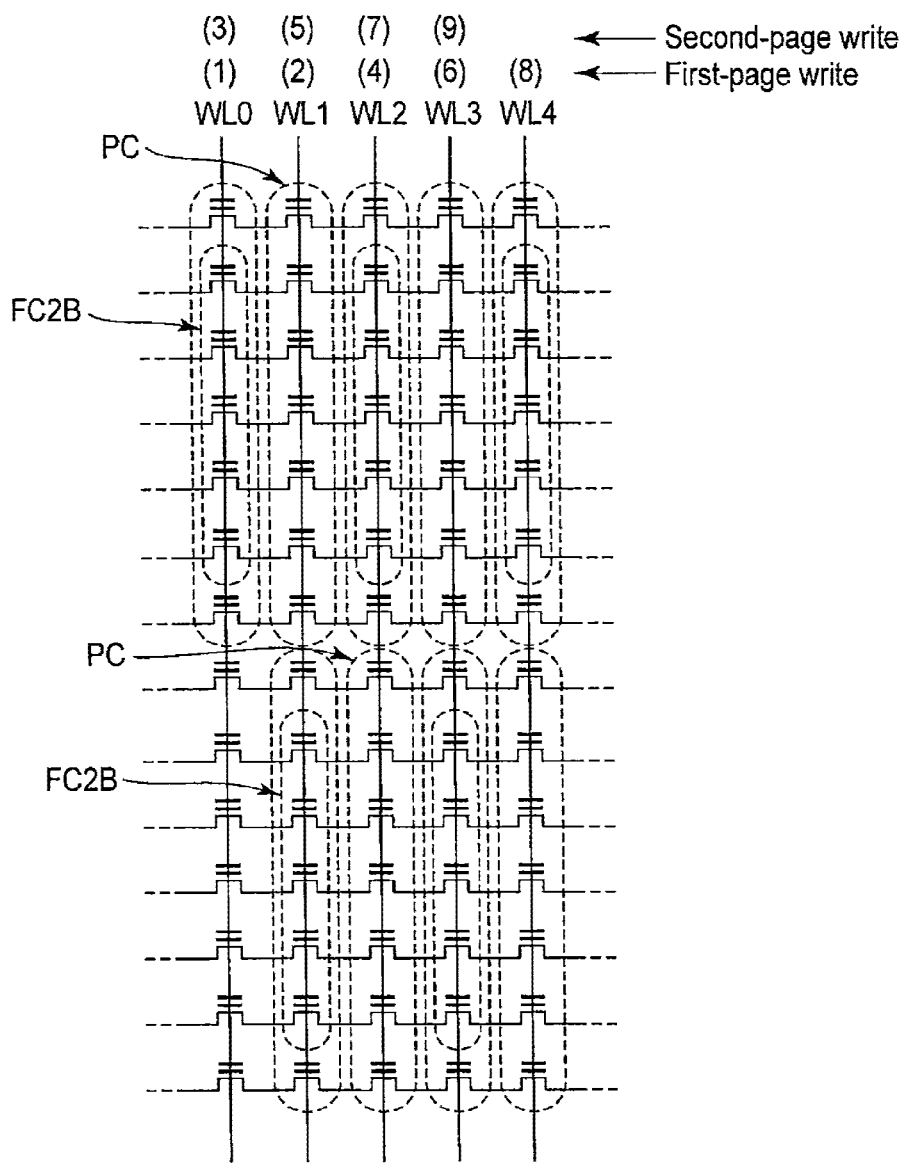
FIG. 30 is a circuit diagram illustrating another example of the flag cell FC2B.
Figure 31:
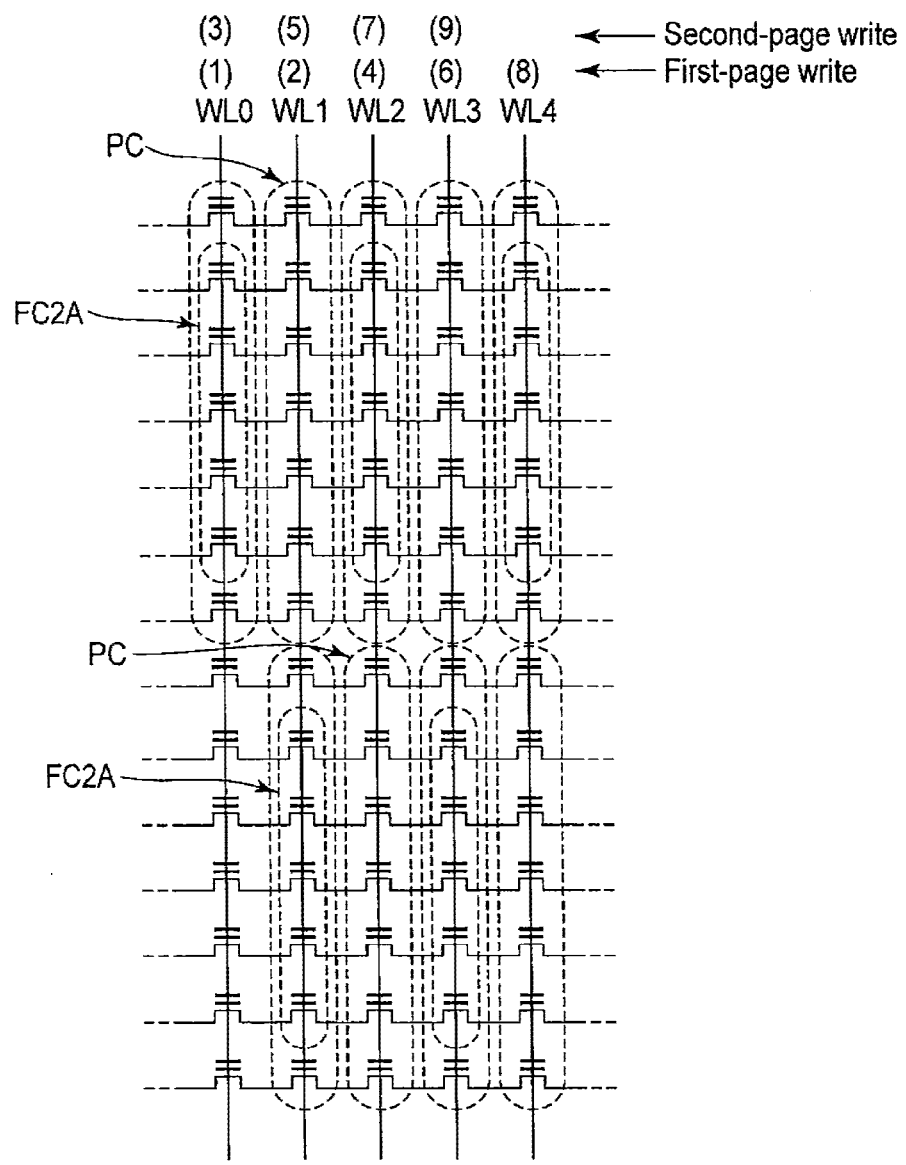
FIG. 31 is a circuit diagram illustrating another example of the flag cell FC2A.

In the second flag region 1-3, the memory cell except the second flag cell FC2B and the boosting cell PC are dummy cells DMC. The dummy cells DMC are the memory cells that do not contribute to the data storage. The dummy cell DMC is not necessary in the case that the influence of the coupling capacitance between the memory cells adjacent to each other is negligible. In this case, as illustrated in FIGS. 30 and 31, the second flag cells FC2B and FC2A can be disposed close to each other in the word-line direction. According to the configuration in FIGS. 30 and 31, the second flag cell FC2B or FC2A connected to the adjacent word line does not include the dummy cell DMC in the word-line direction, so that the downsizing of semiconductor storage device can be achieved.

The flag boosting cell group deviates in the word-line direction. That is, the flag boosting cell group that straddles the word lines WL1 and WL2 deviates from the flag boosting cell group that straddles the word lines WL0 and WL1 in the bit-line direction with the dummy cells DMC interposed therebetween. Similarly, the flag boosting cell group that straddles the word lines WL2 and WL3 deviates from the flag boosting cell group that straddles the word lines WL1 and WL2 in the bit-line direction with the dummy cells DMC interposed therebetween. On the other hand, each three of the flag boosting cell groups are periodically disposed in the bit-line direction in order to reduce an area of the second flag region 1-3 in the word-line direction.

FIG. 12 illustrates a configuration of the second flag region 1-4. In the second flag region 1-4, the second flag cell is indicated by the sign FC2A. Because other configurations are identical to those of the second flag region 1-3, the identical component is designated by the identical sign, and the description is omitted.

(Write Operations of First Flag Cell FC1 and Boosting Cell PC)

Figure 13:
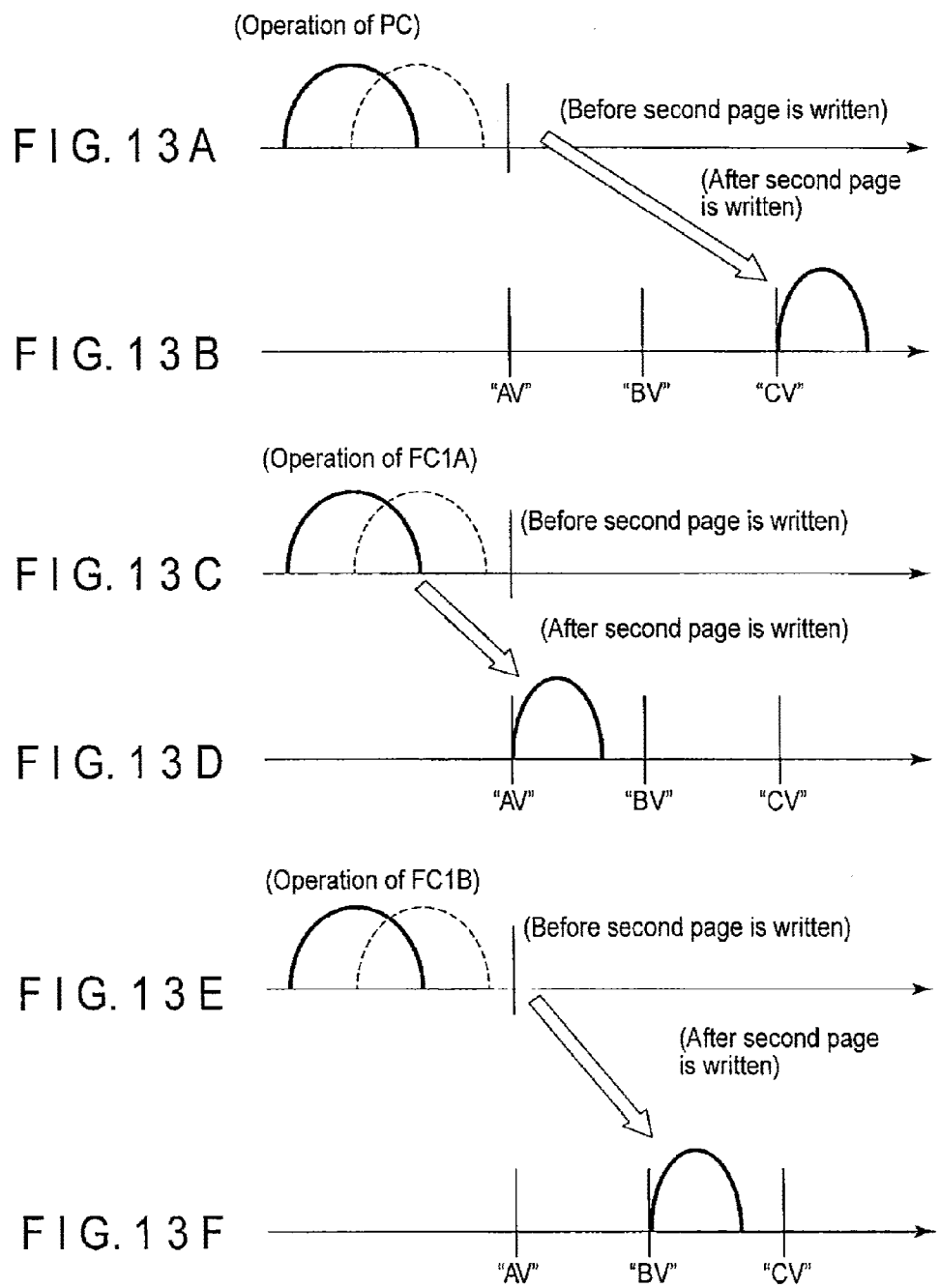
FIGS. 13A and 13B are views illustrating an operation of a boosting cell PC.
FIGS. 13C, 13D, 13E and 13F are views illustrating operations of first flag cells FC1A and FC1B.

FIGS. 13A and 13B illustrate the operation of the boosting cell PC, and FIGS. 13C, 13D, 13E, and 13F illustrate the operations of the first flag cells FC1A and FC1B.

For example, the write operation in not performed to the first flag cells FC1A and FC1B when the first-page data is written in the memory cell MC of the word line WLn in the data region 1-1, but the write operation is performed to the first flag cells FC1A and FC1B when the second-page data is written in the memory cell MC. That is, in writing the second-page data, the first flag cells FC1A and FC1B are raised from the threshold voltages in the erase state in FIGS. 13C and 13E to verify voltages "AV" and "BV" or more in FIGS. 13D and 13F, respectively.

In the case that two kinds of first flag cells (first flag cells FC1A and FC1B) are not provided but one kind of flag cell is provided, similarly to the first flag cell FC1B, in writing the second-page data, the first flag cell is raised from the threshold voltages in the erase state in FIG. 13E to the verify voltage "BV" or more in FIG. 13F.

For example, the write operation in not performed to the boosting cell PC when the first-page data is written in the memory cell MC of the word line WLn, but the write operation is performed to the boosting cell PC when the second-page data is written in the memory cell MC. That is, similarly to the first flag cell FC1, the boosting cell PC is raised from the threshold voltages in the erase state in FIG. 13A to the verify voltage "CV" in FIG. 13B, when the second-page data is written in the memory cell MC that is connected to the word line to which the boosting cell PC is connected.

(Operations of Second Flag Cells FC2A and FC2B)

Figure 14:
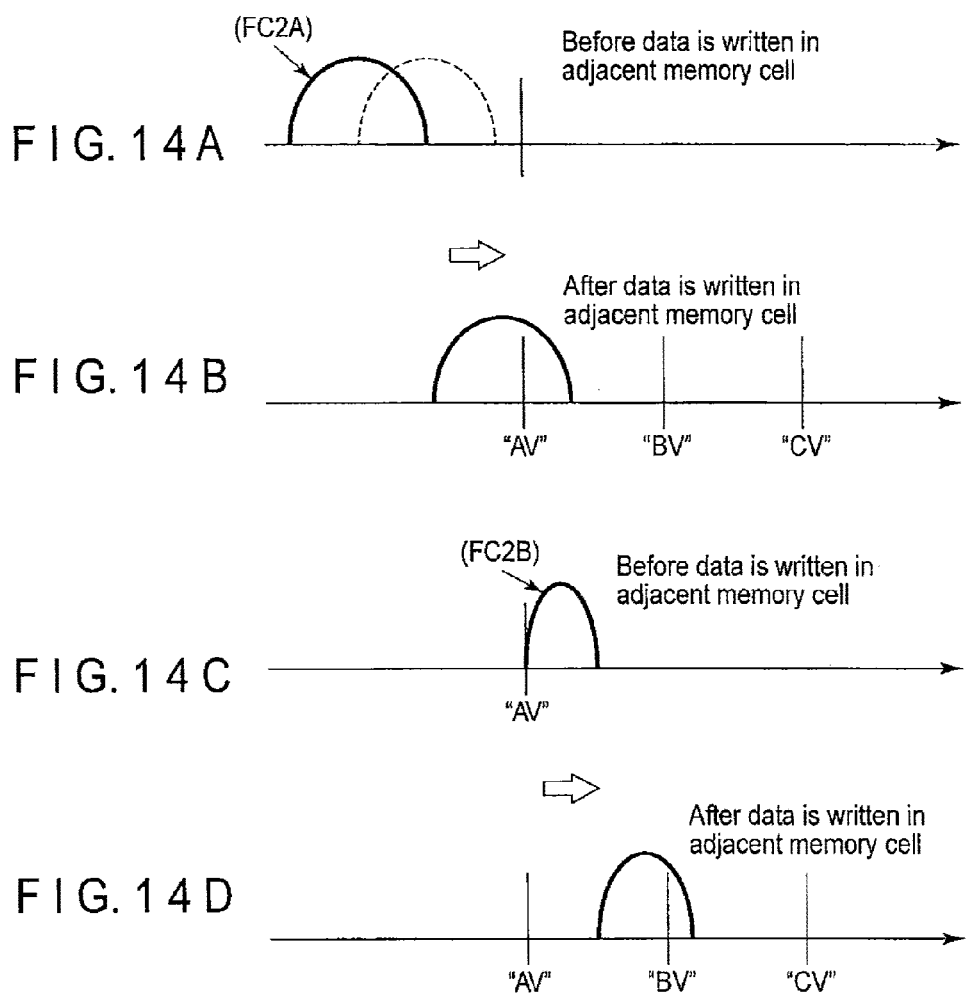
FIGS. 14A and 14B are views illustrating an operation of a second flag cell FC2A.
FIGS. 14C and 14D are views illustrating an operation of a second flag cell FC2B.

FIGS. 14A and 14B illustrate the operation of the second flag cell FC2A, and FIGS. 14C and 14D illustrate the operation of the second flag cell FC2B.

The write operation is performed to the second flag cell FC2A at the erase level or the threshold voltage slightly higher than the erase level as illustrated in FIG. 14A by a broken line before the write operation is performed to the boosting cell PC that is of the adjacent memory cell. At this point, for example, in order to slightly raise the threshold voltage of the second flag cell FC2A higher than the erase level, the threshold voltage of the second flag cell FC2A may previously be raised after the erase operation or at the same time as the first-page data is written in the memory cell MC of the data region 1-1.

Then, for example, in the case that the write operation is performed to the boosting cell PC at the verify voltage "CV" or more, the threshold voltage of the second flag cell FC2A adjacent to the boosting cell PC on the source side (including the case that the second flag cell FC2A is obliquely adjacent to the boosting cell PC) is raised to a range including the verify voltage "AV" by the coupling capacitance with the boosting cell PC as illustrated in FIG. 14B. Preferably the write operation is performed to the boosting cell PC at the verify voltage "CV" or more in order to largely raise the threshold voltage of the second flag cell FC2A.

As illustrated in FIG. 14C, for example, the write operation is performed to the second flag cell FC2B in a range of the verify voltage "AV" or more before the write operation is performed to the boosting cell PC that is of the adjacent memory cell. For example, the write operation is performed at the same time as the first-page data is written in the memory cell MC of the data region 1-1.

Then, for example, in the case that the write operation is performed to the boosting cell PC at the verify voltage "CV" or more, the threshold voltage of the second flag cell FC2B adjacent to the boosting cell PC on the source side (including the case that the second flag cell FC2B is obliquely adjacent to the boosting cell PC) is raised to a range including the verify voltage "BV" by the coupling capacitance with the boosting cell PC as illustrated in FIG. 14D. Preferably the write operation is performed to the boosting cell PC at the verify voltage "CV" or more in order to largely raise the threshold voltage of the second flag cell FC2B.

The second flag cell FC2A is used to determine whether the data is written in the adjacent memory cell when the second-page data is read from the memory cell MC, as will be described later.

The second flag cell FC2B is used to determine whether the data is written in the adjacent memory cell when the first-page data is read from the memory cell MC, as will be described later.

(First-Page Read Operation)

In the case that the first-page data is read from the memory cell MC of the data region 1-1, when the second-page data is not written while the write operation is not performed to the adjacent memory cell, the read voltage "LMR" in FIG. 9B is used as the read voltage of the memory cell MC in the data region 1-1. On the other hand, when the second-page data is written while the write operation is performed to the adjacent memory cell, as illustrated in FIG. 9D, the threshold voltage of the memory cell MC in the data region 1-1 is slightly shifted higher than the threshold voltage in FIG. 9C. Therefore, the control circuit 7 reads the data of the second flag cell FC2B to determine whether the write operation is performed to the adjacent memory cell, and the control circuit 7 determines whether the second-page data is written, thereby fixing the read voltage.

Figure 15:
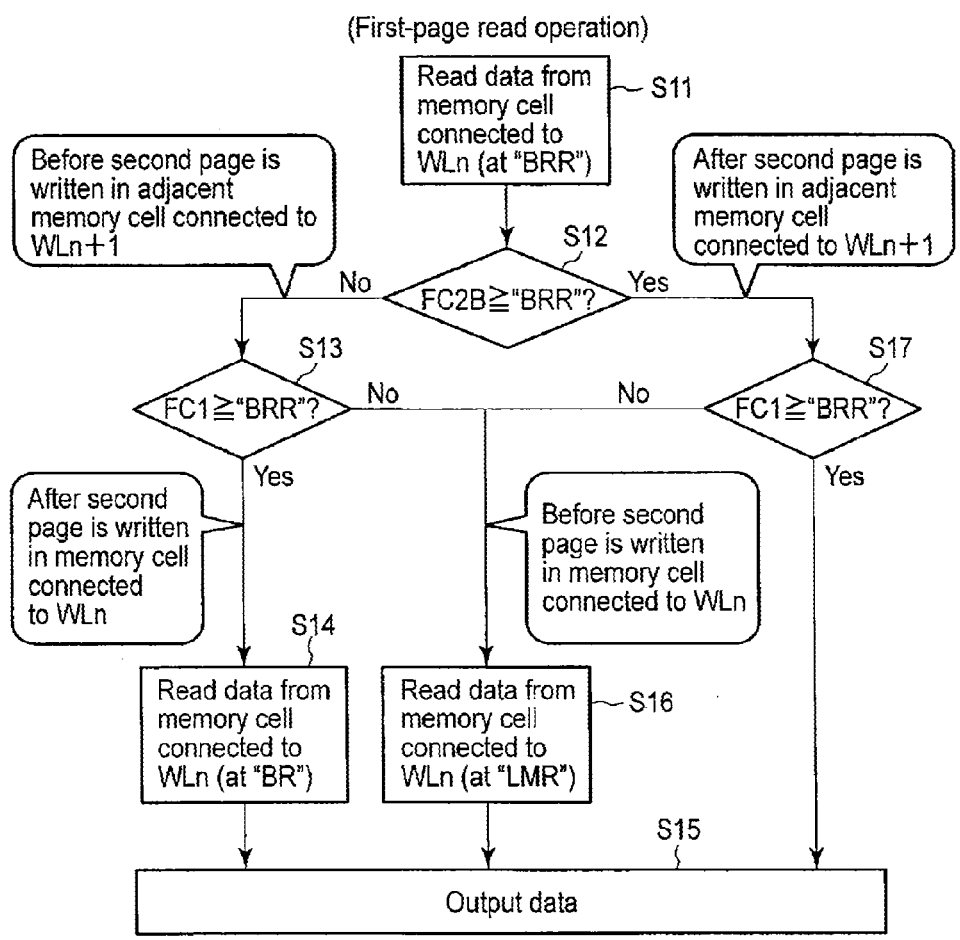
FIG. 15 is a flowchart illustrating a first-page read operation of the first embodiment.

FIG. 15 illustrates the first-page read operation. The first-page read operation is performed such that the control circuit 7 in FIG. 1 controls the memory cell array 1, the bit line control circuit 2, and the word line control circuit 6.

In the first-page read operation, for example, the read voltage "BRR" in FIG. 9 is applied to the word line WLn, and the data are read from the memory cell MC (sometimes referred to as a "selected memory cell MC"), the first flag cell FC1 (FC1B), and the second flag cell FC2B (S11), which are connected to the word line WLn. Specifically, the read data are retained in the data storage circuit 10.

Then, whether the write operation is performed to the second page of the adjacent memory cell is determined using the data of the second flag cell FC2B (S12). The determination is made as follows. There are three second flag cells FC2B. The determination that the write operation is performed to the second page of the adjacent memory cell when two (as a specific value) or more second flag cells FC2B have the read voltage "BRR" or more, and the determination that the write operation is not performed to the second page of the adjacent memory cell when less than two second flag cell FC2B has the read voltage "BRR" or more.

When the determination that the write operation is not performed to the second page of the adjacent memory cell, whether the second-page data is written is determined using the threshold voltage of the first flag cell FC1 (FC1B) (S13). The read operation of the first flag cell FC1 (FC1B) is performed at the same time as the read operation of the second flag cell FC2B. As a result, it is possible to finish the read operation in short time.

When the threshold voltage of the first flag cell FC1 (FC1B) is greater than or equal to the read voltage "BRR" and the second-page data is written, the read voltage "BR" is applied to the word line WLn, and the first-page data is read from the memory cell MC (S14). The read first-page data is output to the outside (S15).

On the other hand, when the data of the first flag cell FC1 (FC1B) is less than the read voltage "BRR" and the second-page data is not written in Step S13, the read voltage "LMR" in FIG. 9, for example, is applied to the word line WLn, and the first-page data is read from the memory cell MC (S16). The read first-page data is output to the outside (S15).

In Step S12, when the determination that the second-page data has been written in the adjacent memory cell, whether the second-page data is written is determined using the threshold voltage of the first flag cell FC1 (S17).

As a result of the determination, when the threshold voltage of the first flag cell FC1 is greater than or equal to the read voltage "BRR" and the second-page data is written, the first-page data that is read from the memory cell MC in the data region 1-1 at the read voltage "BRR" in FIG. 9, for example, is directly output to the outside (S15).

When the data of the first flag cell FC1 is less than the read voltage "BRR" and the second-page data is not written, the read voltage "LMR" is applied to read the first-page data from the memory cell MC (S16). The read first-page data is output to the outside (S15).

When the write operation is not performed to the second page of the memory cell connected to the word line WLn after the write operation is performed to the second page of the memory cell connected to the word line WLn+1, the read voltage is set to "LMR", and the data of the memory cell connected to the word line WLn is read in Step S16. At this point, because the write operation is performed to the second page of the memory cell connected to the word line WLn, the read level is slightly changed from the read voltage "LMR" (a voltage higher than the read voltage "LMR"), and the data of the memory cell connected to the word line WLn may be read.

According to the first-page read operation of the first embodiment, the second flag cell FC2B is provided to determine whether the write operation is performed to the second page of the memory cell adjacent to each word line WLn, and the boosting cell PC is provided adjacent to the second flag cell FC2B in each word line WLn+1 located on the drain side of the second flag cell FC2B. When the second-page data is written in the memory cell MC connected to the word line WLn+1, the data is written in the boosting cell PC, and the threshold voltage of the second flag cell FC2B is shifted upward by the coupling capacitance between the boosting cell PC and the floating gate of the second flag cell FC2B. Therefore, in reading the data, whether the second-page data is written in the adjacent memory cell can be determined by determining the threshold voltage of the second flag cell FC2B, and the read voltage of the memory cell MC can properly be set based on the determination result. Accordingly, the influence of the coupling capacitance with the adjacent memory cell can be suppressed to set the first-page read voltage of the memory cell MC to an optimum value, and the first-page data of the memory cell MC can correctly be read.

Additionally, the data of the second flag cell FC2B is read at the same time as the data of the first flag cell FC1 (FC1B) and the memory cell MC, and the read voltage of the memory cell MC is fixed according to the read result. That is, it is not necessary that the data of the memory cell MC adjacent on the drain side of the selected memory cell MC be read in order to set the read voltage to the optimum value. As a result, the high-speed read operation can be performed in the first embodiment.

(First-Page Read Operation) (First Modification)

Figure 16:
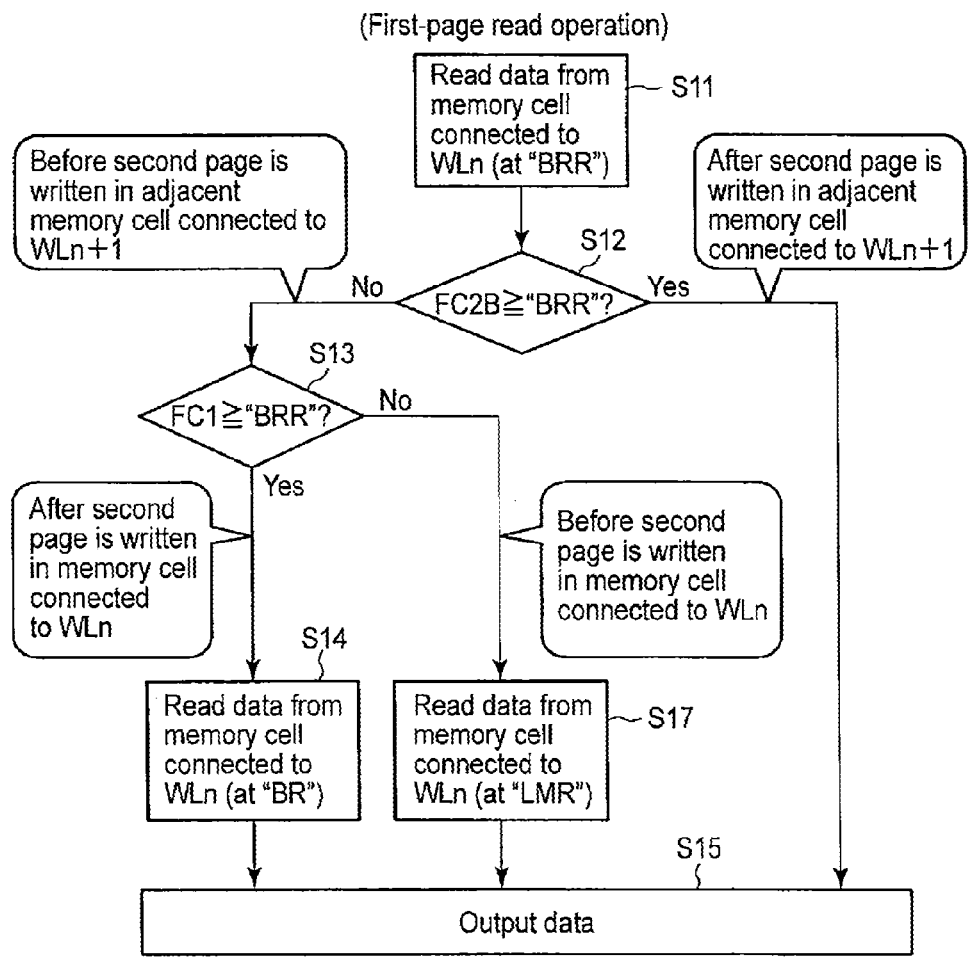
FIG. 16 is a flowchart illustrating a first-page read operation according to a first modification of the first embodiment.

FIG. 16 illustrates a first modification of the flowchart in FIG. 15, and the same component as that in FIG. 15 is designated by the same sign.

The threshold voltage of the first flag cell FC1 is determined, when the data of the second flag cell FC2B is greater than or equal to the read voltage "BRR", and the data is written in the adjacent memory cell in Step S12 of FIG. 15. However, as described above, the first flag cell FC1 (FC1B) is written at the same time as the write operation is performed to the second page of the selected memory cell MC. For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1. Therefore, when the determination that the data is written in the adjacent memory cell in Step S12, it is not necessary to determine whether the second-page data is written in the memory cell MC.

In the first modification in FIG. 16, the determination whether the data is written in the first flag cell FC1 (FC1B) is omitted. That is, when the determination that the data of the second flag cell FC2B is greater than or equal to the read voltage "BRR" in Step S12, the threshold voltage of the first flag cell FC1 (FC1B) is not determined, but the first-page data that is read from the memory cell MC at the read voltage "BRR" in Step S11 is immediately output to the outside (S15).

The same advantageous effect as the first embodiment can be obtained by the first modification. Additionally, according to the first modification, when the data of the second flag cell FC2B is greater than or equal to the read voltage "BRR", and the second-page data is written in the adjacent memory cell, the data that is read from the memory cell MC at the read voltage "BRR" is immediately output without determining the threshold voltage of the first flag cell FC1 (FC1B). Accordingly, the circuit can be simplified.

(First-Page Read Operation) (Second Modification)

Figure 17:
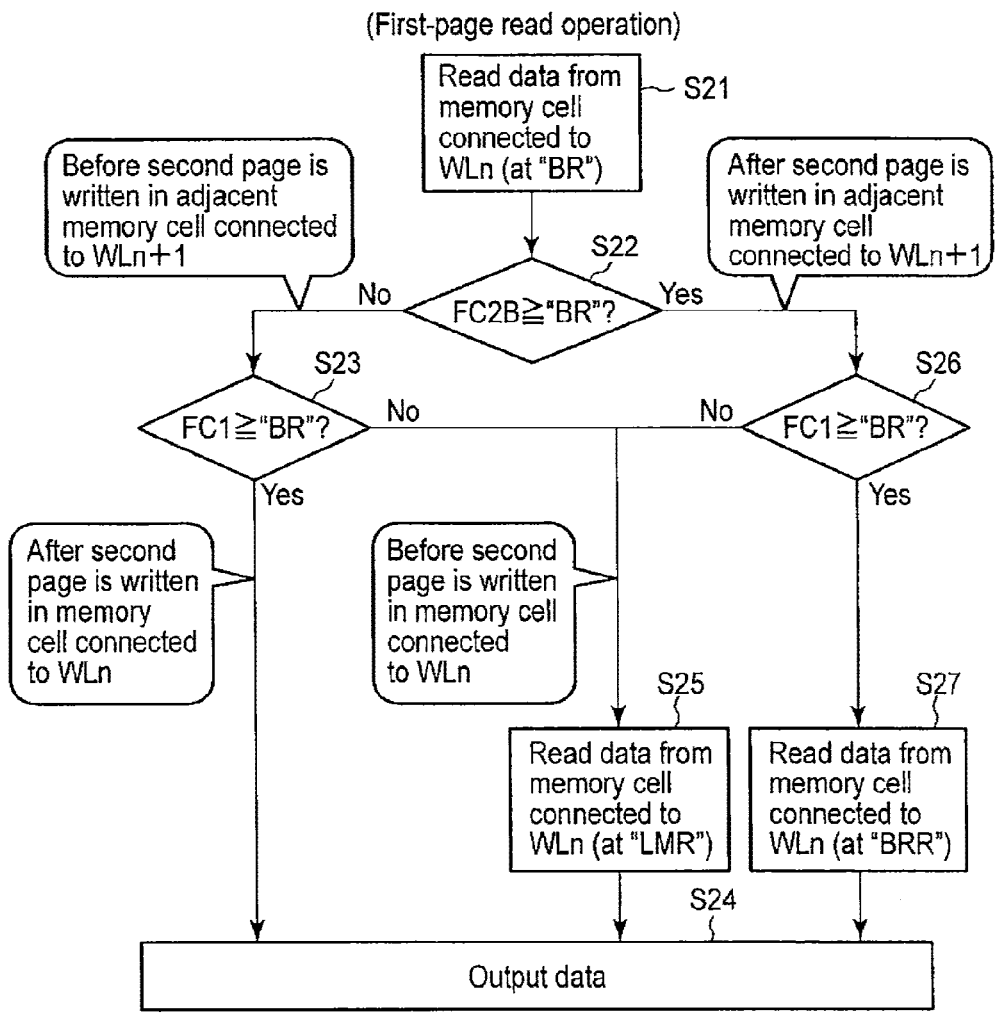
FIG. 17 is a flowchart illustrating a first-page read operation according to a second modification of the first embodiment.

FIG. 17 illustrates a first-page read operation according to a second modification.

In the first embodiment and the first modification, the read voltage of the word line WLn is set to the "BRR" in FIG. 9 on the assumption that the second-page data is written in the memory cell MC and that the second-page data is written in the adjacent memory cell. On the other hand, in the second modification, the read voltage is set to the "BR" in FIG. 9 on the assumption that the second-page data is not written in the adjacent memory cell.

The read voltage "BR" is applied to the word line WLn, and the data of the memory cell MC, the first flag cell FC1 (FC1B), and the second flag cell FC2B, which are connected to the word line WLn, are read on the data storage circuit 10 (S21).

Then, whether the threshold voltage of the second flag cell FC2B is greater than or equal to the read voltage "BR" is determined (S22). When the threshold voltage of the second flag cell FC2B is less than the read voltage "BR", and the write operation is not performed to the second page of the adjacent memory cell, whether the threshold voltage of the first flag cell FC1 (FC1B) is greater than or equal to the read voltage "BR" is determined (S23).

When the threshold voltage of the first flag cell FC1 (FC1B) is greater than or equal to the read voltage "BR", and the second-page data is written in the memory cell, the first-page data that is read from the memory cell MC at the read voltage "BR" is immediately output to the outside (S24).

On the other hand, the determination result of Step 23, when the threshold voltage of the first flag cell FC1 (FC1B) is less than the read voltage "BR", and the second-page data is not written in the memory cell, the read voltage "LMR" is applied to the word line WLn to read the data of the memory cell MC (S25). The read first-page data is output to the outside (S24).

In Step S22, when the threshold voltage of the second flag cell FC2B is greater than or equal to the read voltage "BR", and the second-page data is written in the adjacent memory cell, whether the threshold voltage of the first flag cell FC1 (FC1B) is greater than or equal to the read voltage "BR" is determined (S26).

When the threshold voltage of the first flag cell FC1 (FC1B) is less than the read voltage "BR" in Step S26, namely, when the determination that the second-page data is not written in the memory cell MC while the second-page data is written in the adjacent memory cell, the read voltage "LMR" is applied to the word line WLn to read the data from the memory cell MC (S25). The read first-page data is output to the outside (S24).

When the threshold voltage of the first flag cell FC1 (FC1B) is greater than or equal to the read voltage "BR" in Step S26, namely, when the second-page data is written in the memory cell MC while the second-page data is written in the adjacent memory cell, the read voltage "BRR" is applied to the word line WLn to read the data from the memory cell MC (S27). The read first-page data is output to the outside (S24).

In the second modification, the first-page data can correctly be read like the first embodiment. Additionally, the read operation is performed to the second flag cell FC2B at the read voltage "BR". Because the threshold voltage of the second flag cell FC2B is raised by the coupling capacitance of the adjacent memory cell, possibly the threshold voltage of the second flag cell FC2B is insufficiently higher than the read voltage "BRR". Therefore, the read margin can largely be taken compared with the case that the read operation is performed at the read voltage "BRR". Accordingly, the threshold voltage of the second flag cell FC2B can correctly be read, and the read voltage of the memory cell MC can securely be set.

(First-Page Read Operation) (Third Modification)

Figure 18:
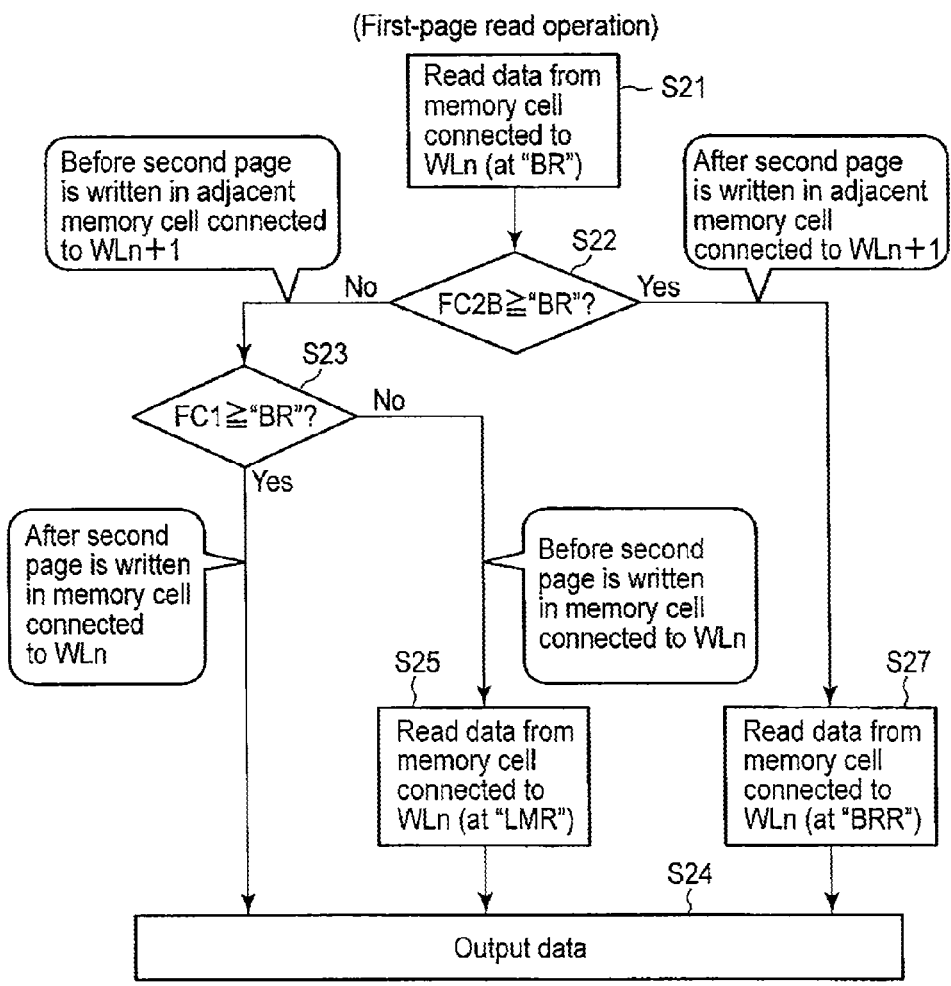
FIG. 18 is a flowchart illustrating a first-page read operation according to a third modification of the first embodiment.

FIG. 18 illustrates a first-page read operation according to a third modification, and the same component as that in FIG. 17 is designated by the same sign.

In Step S22 of FIG. 17, when the data of the second flag cell FC2B is greater than or equal to the read voltage "BR", and the second-page data is written in the adjacent memory cell, the threshold voltage of the first flag cell FC1 (FC1B) is determined.

In the third modification in FIG. 18, the determination of whether the data is written in the first flag cell FC1 (FC1B) is omitted. For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1. Therefore, when the determination that the second-page data is written in the adjacent memory cell in Step S22, the threshold voltage of the first flag cell FC1 (FC1B) is not determined, the read voltage "BRR" is applied to the word line WLn to read the first-page data from the memory cell MC (S27). The read first-page data is output to the outside (S24).

The same advantageous effect as the second modification can be obtained by the third modification. Additionally, according to the third modification, when the data of the second flag cell FC2B is greater than or equal to the read voltage "BR", and the data is written in the second page of the adjacent memory cell, the first-page data is read from the memory cell MC at the read voltage "BRR" without determining the threshold voltage of the first flag cell FC1 (FC1B). Accordingly, the circuit can be simplified compared with the second modification.

(Second-Page Read Operation)

Figure 19:
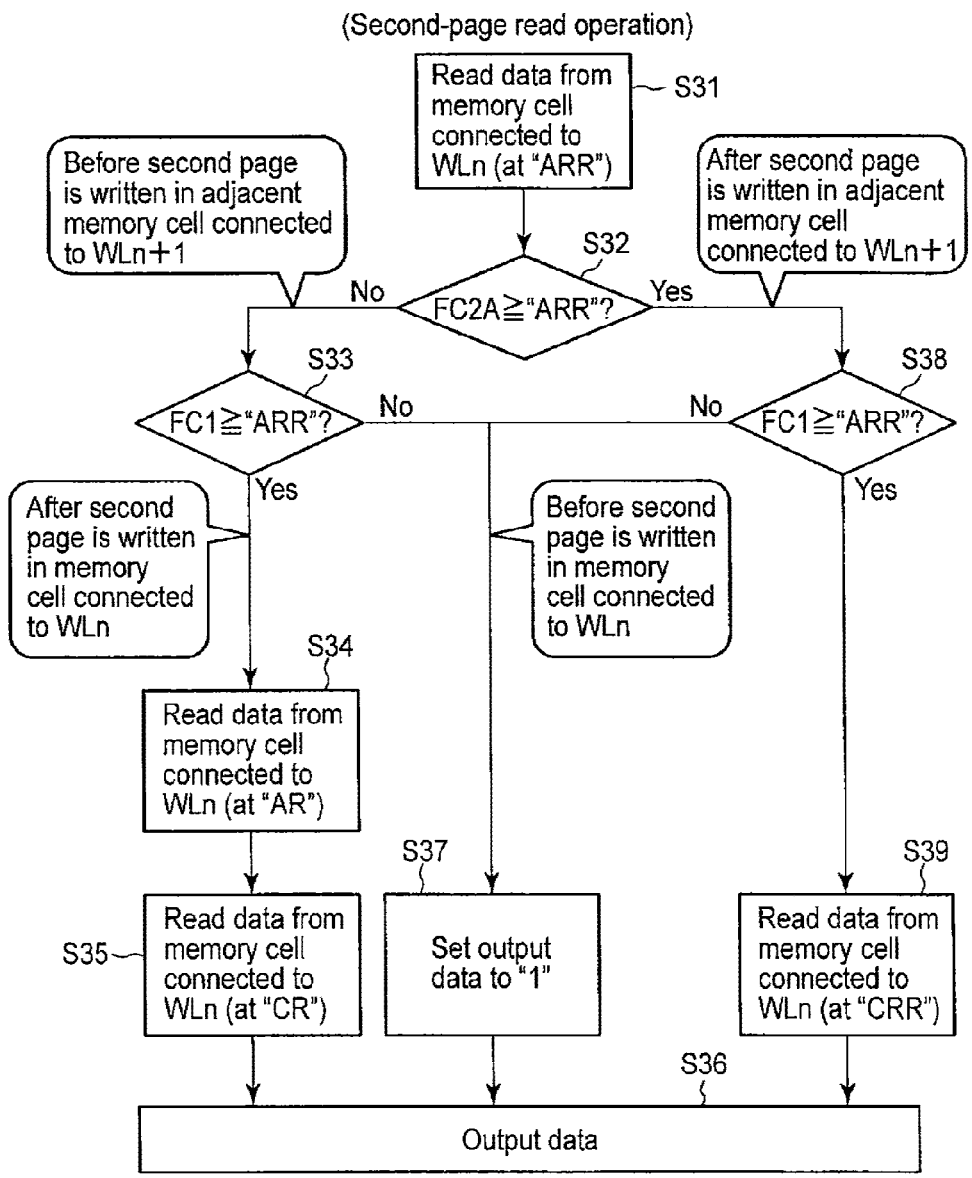
FIG. 19 is a flowchart illustrating a second-page read operation of the first embodiment.

FIG. 19 illustrates a second-page read operation of the first embodiment.

As illustrated in FIG. 9C, in addition to the data written at the verify voltage "BV", the data written at the verify voltages "AV" and "CV" exist in the second page. Additionally, the threshold voltage is shifted upward as illustrated in FIG. 9D when the second-page data is written in the adjacent memory cell.

Therefore, in the second-page read operation, whether the second-page data is written in the adjacent memory cell is determined using, for example, the second flag cell FC2A. That is, first the read voltage "ARR" is applied to the word line WLn, and the data of the memory cell MC, the first flag cell FC1 (FC1A), and the second flag cell FC2A, which are connected to the word line WLn, are read on the data storage circuit 10 (S31).

Then, whether the second-page data is written in the adjacent memory cell is determined using the data of the second flag cell FC2A. The determination operation is identical to the determination operation in which the second flag cell FC2B is used.

When the threshold voltage of the second flag cell FC2A is less than the read voltage "ARR" and the second-page data is not written in the adjacent memory cell, whether the threshold voltage of the first flag cell FC1 (FC1A) is greater than or equal to the read voltage "ARR" is determined (S33).

When the threshold voltage of the first flag cell FC1 (FC1A) is greater than or equal to the read voltage "ARR", namely, when the second-page data is written in the memory cell MC while the second-page data is not written in the adjacent memory cell, the threshold voltage of the memory cell MC is not shifted upward after the second-page write operation. Therefore, the read voltage "AR" is applied to the word line WLn to read the second data of the memory cell MC (S34), and the read voltage "CR" is applied to the word line WLn to read the second data of the memory cell MC (S35). The thus read second-page data is output to the outside (S36).

When the threshold voltage of the first flag cell FC1 (FC1A) is less than the read voltage "ARR" in Step S33, because the second-page data is not written in the memory cell MC, the output data is set to "1" (S37), and output to the outside (S36).

When the threshold voltage of the second flag cell FC2A is greater than or equal to the read voltage "ARR" and the second-page data is written in the adjacent memory cell in Step S32, whether the threshold voltage of the first flag cell FC1 (FC1A) is greater than or equal to the read voltage "ARR" is determined (S38).

When the threshold voltage of the first flag cell FC1 (FC1A) is less than the read voltage "ARR" and the second-page data is not written in the memory cell MC, the output data is set to "1" (S37), and output to the outside (S36).

In the second-page read operation, the read voltage of the word line WLn is reread as "AR" in Step S34. Alternatively, Step S34 is omitted, and the read result with the read voltage "ARR" of the word line WLn in Step S31 may be used instead. In this case, when the data is written in the second page of the adjacent memory cell, the read voltage can be set as follows.

The read voltage "ARR" is used as the read voltage of the data "2", and the read voltage "CR" or "CRR" can be used as the read voltage of the data "4" according to the first flag cell FC1 (FC1A) connected to the word line WLn+1.

As a result of the determination of Step S38, when the threshold voltage of the first flag cell FC1 (FC1A) is greater than or equal to the read voltage "ARR", and the second-page data is written in the memory cell MC, because the second-page data is shifted upward, the read voltage "CRR" is applied to the word line WLn to read the second-page data from the memory cell MC (S39). The read second-page data is output to the outside (S36).

According to the second-page read operation, the second flag cell FC2A is provided in order to determine whether the data is written in the memory cell adjacent to the word line WLn, the boosting cell PC is provided adjacent to the second flag cell FC2A in each word line WLn+1 located on the drain side of the second flag cell FC2A, the data is written in the boosting cell PC when the second-page data is written in the memory cell MC connected to the word line WLn+1, and the threshold voltage of the second flag cell FC2A is shifted upward by the coupling capacitance between the boosting cell PC and the floating gate of the second flag cell FC2A. Therefore, in reading the data, whether the second-page data is written in the adjacent memory cell can be determined by determining the threshold voltage of the second flag cell FC2A, and the read voltage of the memory cell MC can be set based on the determination result. Accordingly, the influence of the coupling capacitance with the adjacent memory cell can be suppressed to set the second-page read voltage of the memory cell MC to the optimum value, and the second-page data of the memory cell MC can correctly be read.

Additionally, the data of the second flag cell FC2A is read at the same time as the data of the selected memory cell MC, and the read voltage of the memory cell MC is fixed according to the read result. That is, it is not necessary that data of the memory cell MC adjacent on the drain side of the selected memory cell MC be read in order to set the read voltage to the optimum value. As a result, high-speed read operation can be performed in the first embodiment.

(Second-Page Read Operation) (First Modification)

FIG. 20 illustrates a second-page read operation according to a first modification, and the same component as that in FIG. 19 is designated by the same sign.

In the first embodiment in FIG. 19, when the data of the second flag cell FC2A is greater than or equal to the read voltage "ARR", and the second-page data is written in the adjacent memory cell in Step S32, the threshold voltage of the first flag cell FC1 (FC1A) is determined. However, as described above, the threshold voltage of the second flag cell FC2A is raised by the second-page write operation of the memory cell MC adjacent on the drain side of the selected memory cell MC. Therefore, when the determination that the data is written in the memory cell MC adjacent on the drain side in Step S32, it is not necessary to determine whether the second-page data is written in the selected memory cell MC. For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1.

Therefore, the determination whether the data is written in the first flag cell FC1 (FC1A) is omitted in the first modification in FIG. 20. When the determination that the data of the second flag cell FC2A is greater than or equal to the read voltage "ARR" in Step S32, the read voltage "CRR" is applied to the word line WLn to read the second-page data from the read memory cell MC (S39). The read second-page data is output to the outside (S36).

In the second-page read operation, the read voltage of the word line WLn is reread as "ARR" in Step S34. Alternatively, Step S34 is omitted, and the read result with the read voltage "AR" of the word line WLn in Step S31 may be used instead. In this case, when the data is written in the second page of the adjacent memory cell, the read voltage can be set as follows. The read voltage "ARR" is used as the read voltage of the data "2", and the read voltage "CR" or "CRR" can be used as the read voltage of the data "4" according to the first flag cell FC1 (FC1A) connected to the word line WLn+1.

The same advantageous effect as the second-page read operation of the first embodiment can be obtained by the first modification. Additionally, according to the first modification, when the determination that the second-page data is written in the adjacent memory cell, the operation to determine the threshold voltage of the first flag cell FC1 (FC1A) is omitted, and the data read from the memory cell MC at the read voltage "CRR" is immediately output. Accordingly, the circuit can be simplified compared with the flowchart in FIG. 19.

(Second-Page Read Operation) (Second Modification)

Figure 21:
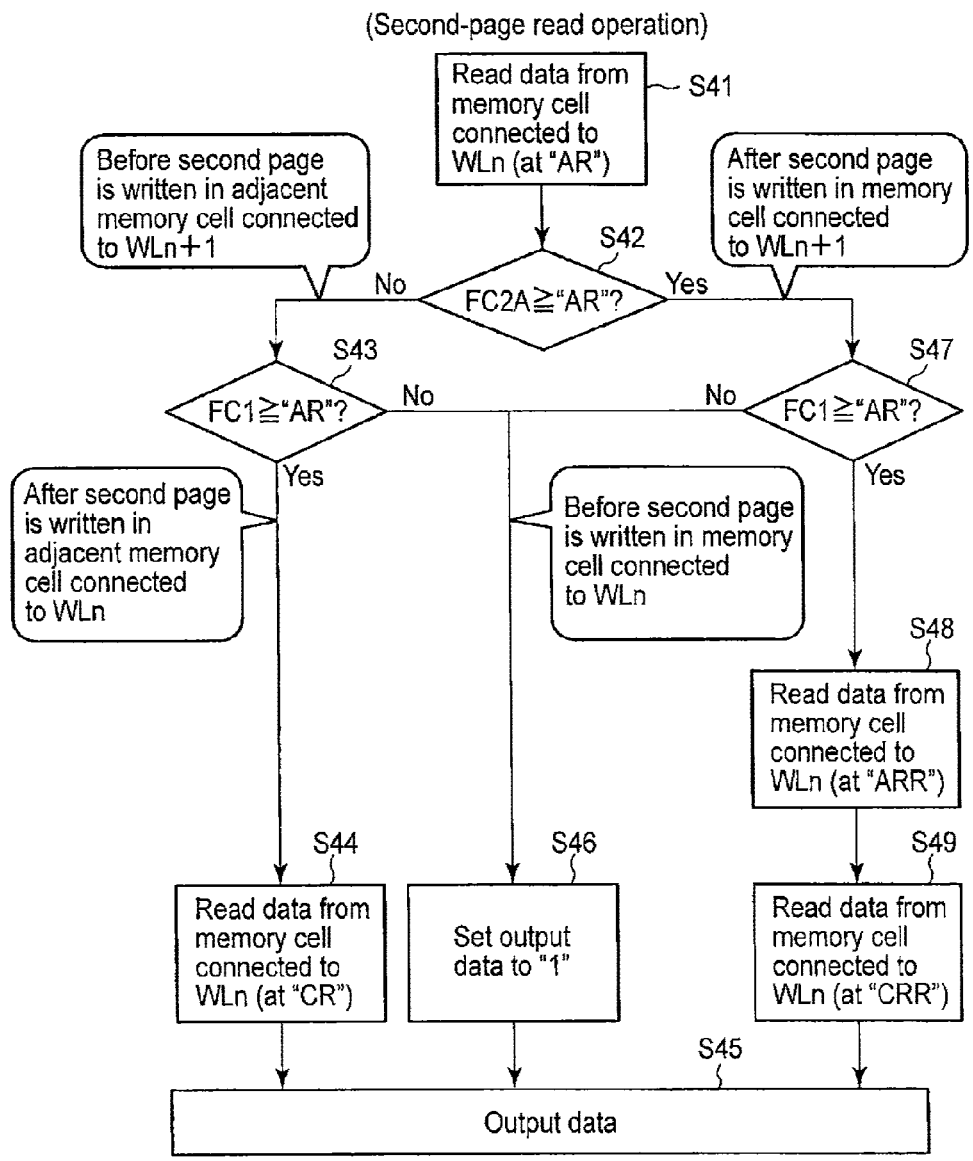
FIG. 21 is a flowchart illustrating a second-page read operation according to a second modification of the first embodiment.

FIG. 21 illustrates a second-page read operation according to a second modification.

In the second-page read operations in FIGS. 19 and 20, on the assumption that the second-page data is written in the adjacent memory cell, the read voltage "ARR" is applied to the word line WLn to read the data from the memory cell MC, the first flag cell FC1 (FC1A), and the second flag cell FC2A.

On the other hand, in the second modification, it is assumed that the second-page data is not written in the adjacent memory cell. Therefore, the read voltage "AR" is applied to the word line WLn to read the data from the memory cell MC, the first flag cell FC1 (FC1A), and the second flag cell FC2A (S41).

Whether the threshold voltage read from the second flag cell FC2A is greater than or equal to the read voltage "AR" is determined (S42). When the threshold voltage read from the second flag cell FC2A is less than the read voltage "AR", and the second-page data is not written in the adjacent memory cell, whether the threshold voltage read from the first flag cell FC1 (FC1A) is greater than or equal to the read voltage "AR" is determined (S43).

When the threshold voltage read from the first flag cell FC1 (FC1A) is greater than or equal to the read voltage "AR", and the second-page data is written in the memory cell MC, the read voltage "CR" is applied to the word line WLn. Then the second-page data of the selected memory cell MC read at the read voltage "AR" in Step 41 and the second-page data of the selected memory cell MC read at the read voltage "CR" in Step 44 are output to the outside (S45).

When the threshold voltage read from the first flag cell FC1 (FC1A) is less than the read voltage "AR", and the second-page data is not written in the memory cell MC in Step S43, the output data is set to "1" (S46), and output to the outside (S45).

On the other hand, when the threshold voltage read from the second flag cell FC2A is greater than or equal to the read voltage "AR", and the second-page data is written in the adjacent memory cell in Step S42, whether the threshold voltage read from the first flag cell FC1 (FC1A) is greater than or equal to the read voltage "AR" is determined (S47).

When the threshold voltage read from the first flag cell FC1 (FC1A) is less than the read voltage "AR", and the second-page data is not written in the memory cell MC, the output data is set to "1" (S46), and output to the outside (S45).

When the threshold voltage read from the first flag cell FC1 (FC1A) is greater than or equal to the read voltage "AR", and the second-page data is written in the memory cell MC in Step S47, because the data is also written in the second page of the memory cell MC adjacent on the drain side, the threshold voltage of the memory cell MC is shifted upward as illustrated in FIG. 9D. Therefore, the read voltage "ARR" is applied to the word line WLn to read the data from the memory cell MC (S48), and then the read voltage "ARR" is applied to the word line WLn to read the data from the memory cell MC (S49). The read second-page data are output to the outside (S45).

In the second-page read operation, the read voltage of the word line WLn is reread as "ARR" in Step S48. Alternatively, Step S48 is omitted, and the read result with the read voltage "AR" of the word line WLn in Step S41 may be used instead. In this case, when the second-page data is written in the adjacent memory cell, the read voltage can be set as follows. The read voltage "AR" is used as the read voltage of the data "2", and the read voltage "CR" or "CRR" can be used as the read voltage of the data "4" according to the first flag cell FC1 (FC1A) connected to the word line WLn+1.

According to the second modification, the threshold voltage of the second flag cell FC2A is determined using the read voltage "AR", the data is read from the memory cell MC at the read voltage "CR" when the second-page data is not written in the adjacent memory cell while the second-page data is written in the memory cell MC, and the data is read from the memory cell MC at the read voltages "ARR" and "CRR" when the second-page data is written in the adjacent memory cell while the second-page data is written in the memory cell MC. Therefore, for the same reason as the first-page read operation of the second modification, the data can securely be read from the memory cell MC.

(Second-Page Read Operation) (Third Modification)

FIG. 22 illustrates a second-page read operation according to a third modification, and the same component as that in FIG. 21 is designated by the same sign.

In the second modification in FIG. 21, when the threshold voltage read from the second flag cell FC2A is greater than or equal to the read voltage "AR", and the second-page data is written in the adjacent memory cell, whether the threshold voltage read from the first flag cell FC1 (FC1A) is greater than or equal to the read voltage "AR" is determined (S42 and S47).

However, the threshold voltage of the second flag cell FC2A is shifted upward by the coupling capacitance with the boosting cell PC when the second-page data is written in the memory cell MC adjacent on the drain side. When the second-page data is written in the adjacent memory cell, the second-page data is already written in the memory cell MC selected at the same time as the second flag cell FC2A, it is not necessary that to determine the threshold voltage of the first flag cell FC1 (FC1A). For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1.

Therefore, in the third modification in FIG. 22, when the second-page data is written in the adjacent memory cell, the determination of the threshold voltage of the first flag cell FC1 (FC1A) is omitted, and subsequent to Step S42 the data is read from the memory cell MC at the read voltages "ARR" and "CRR" and output (S48, S49, and S45).

In the second-page read operation, the read voltage of the word line WLn is reread as "ARR" in Step S48. Alternatively, Step S48 is omitted, and the read result with the read voltage "AR" of the word line WLn in Step S41 may be used instead. In this case, when the data is written in the second page of the adjacent memory cell, the read voltage can be set as follows. The read voltage "AR" is used as the read voltage of the data "2", and the read voltage "CR" or "CRR" can be used as the read voltage of the data "4" according to the first flag cell FC1 (FC1A) connected to the word line WLn+1.

According to the third modification, when the determination that the second-page data is written in the adjacent memory cell, the determination of the threshold voltage of the first flag cell FC1 (FC1A) is omitted, and the data is read from the memory cell MC at the read voltages "ARR" and "CRR" and output. Therefore, the second-page data read speed can be enhanced compared with the second modification.

In the first embodiment, the two kinds of the second flag cells FC2A and FC2B are prepared, and the threshold voltages of the second flag cells FC2A and FC2B are raised by the boosting cell PC. However, in the case that the plurality of kinds of the second flag cells are not required, only one kind of the second flag cell may be disposed while one of the plurality of kinds of the second flag cells is omitted. For example, in the case that the threshold voltage fluctuates largely among the floating gates, the second flag cell FC2A is omitted, and only the second flag cell FC2B is disposed. The boosting cell PC can raise the threshold voltage of the second flag cell FC2B from the level in FIG. 14A to the level in FIG. 14D. As a result, an area occupied by the second flag cell can be reduced.

Second Embodiment

First-Page Read Operation

Figure 23:
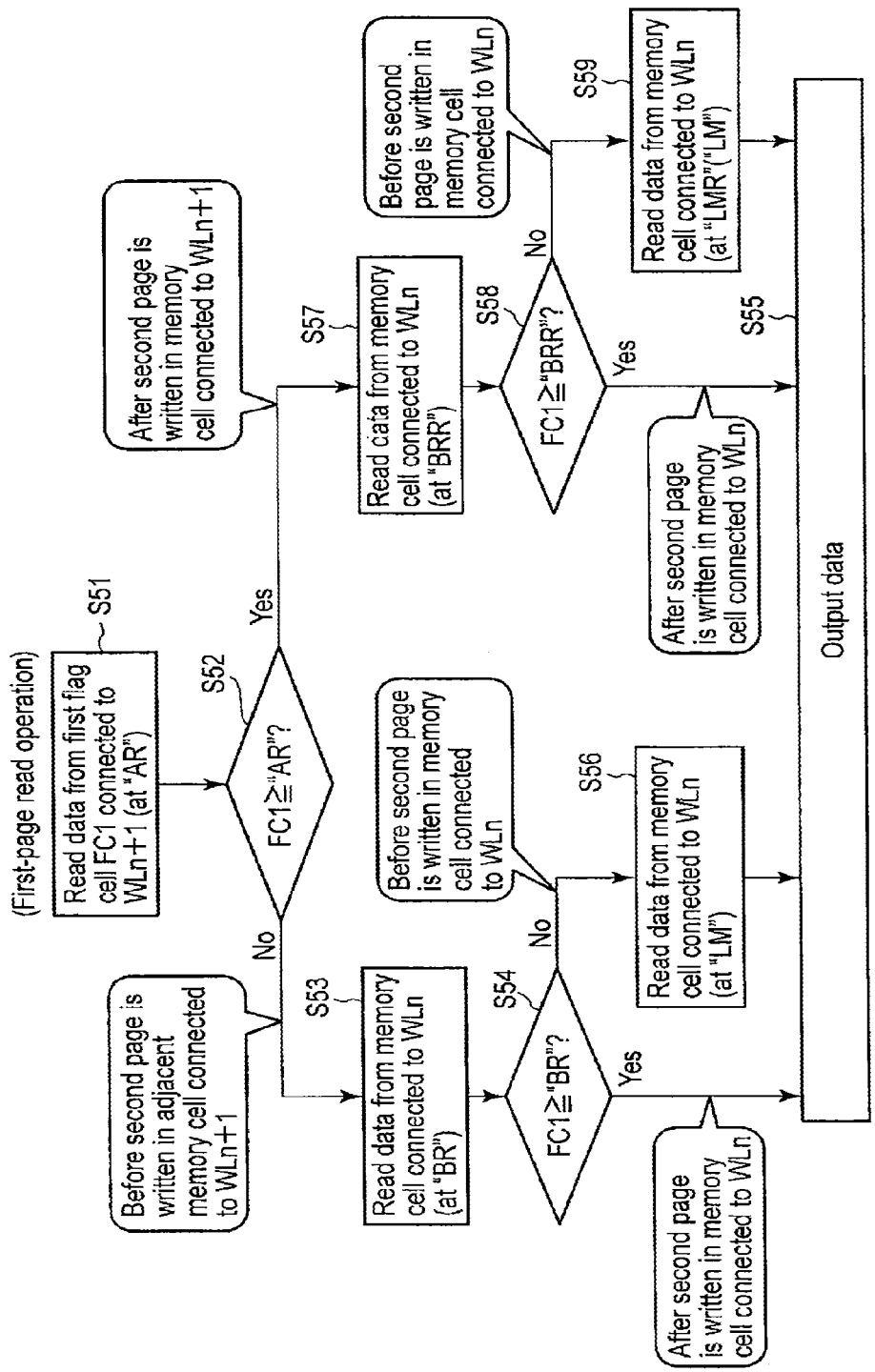
FIG. 23 is a flowchart illustrating a first-page read operation according to a second embodiment.
Figure 27:
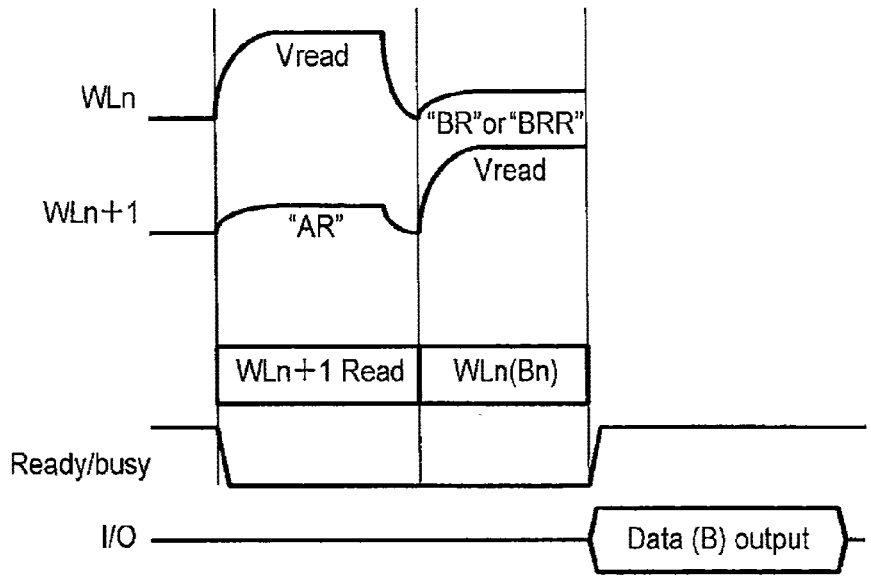
FIG. 27 is a waveform chart illustrating the first-page read operation of the second embodiment.

FIGS. 23 and 27 illustrate a first-page read operation according to a second embodiment. In the first embodiment, whether the second-page data is written in the adjacent memory cell is determined using the second flag cells FC2A and FC2B.

On the other hand, in the second embodiment, whether the second-page data is written in the adjacent memory cell is determined with no use of the second flag cells FC2A and FC2B by determining the threshold voltage of the first flag cell FC1 that is connected to the word line WLn+1 adjacent in the drain direction of the memory cell connected to the read-target word line WLn.

That is, first, for example, the read voltage "AR" is applied to the word line WLn+1 adjacent in the drain direction with respect to the read-target word line WLn, and the data is read from the first flag cell FC1 connected to the word line WLn+1 (S51 and FIG. 27).

Then, whether the threshold voltage of the first flag cell FC1 (although either the first flag cell FC1A or the first flag cell FC1B may be used, the wider read margin is ensured in reading the first flag cell FC1B) connected to the word line WLn+1 is greater than or equal to the read voltage "AR" is determined (S52).

Only the first flag cell FC1 may be read in the read operation of the word line WLn+1. That is, it is not necessary to read the data from the read-target memory cell MC. Therefore, power consumption can be suppressed such that a circuit associated with the read operation of the read-target memory cell MC is not operated (for example, the data storage circuit 10 connected to the read-target memory cell MC is not operated).

As a result, when the threshold voltage of the first flag cell FC1 connected to the word line WLn+1 is less than the read voltage "AR", and the second-page data is not written in the adjacent memory cell, the read voltage "BR" is applied to the read-target word line WLn to read the data of the memory cell MC and the first flag cell FC1 (FC1B) (S53 and FIG. 27).

Then, whether the threshold voltage of the first flag cell FC1 (FC1B) is greater than or equal to the read voltage "BR" is determined (S54). When the threshold voltage of the first flag cell FC1 (FC1B) is greater than or equal to the read voltage "BR", because the second-page data is written, the data read from the memory cell MC at the read voltage "BR" is output to the outside (S55).

When the threshold voltage of the first flag cell FC1 (FC1B) is less than the read voltage "BR" in Step S54, the second-page data is not written, and the second-page data of the adjacent memory cell is not written. Therefore, the read voltage "LM" in FIG. 9 is applied to the word line WLn to read the first-page data from the memory cell MC (S56). The read data is output to the outside (S55).

On the other hand, when the threshold voltage of the first flag cell FC1 (FC1B) connected to the word line WLn+1 is greater than or equal to the read voltage "AR", and the second-page data is written in the adjacent memory cell in Step S52, the read voltage "BRR" higher than the read voltage "BR" is applied to the read-target word line WLn to read the data of the first flag cell FC1 (FC1B) and the memory cell MC (S57).

Then, whether the threshold voltage of the first flag cell FC1 (FC1B) is greater than or equal to the read voltage "BRR" is determined (S58). When the threshold voltage of the first flag cell FC1 (FC1B) is greater than or equal to the read voltage "BRR", the second-page data is written in the selected memory cell MC, and the second-page data is also written in the adjacent memory cell. Therefore, the first-page data read from the memory cell MC at the read voltage "BRR" is output to the outside (S55).

When the threshold voltage of the first flag cell FC1 is less than the read voltage "BRR", and the second page of the adjacent memory cell is written while the second page of the memory cell MC is not written, the first-page data is read from the memory cell MC connected to the word line WLn at the read voltage "LM" slightly lower than the read voltage "LMR" or "LMR" (S59). The read first-page data is output to the outside (S55).

According to the first-page read operation of the second embodiment, the threshold voltage of the first flag cell FC1 that is connected to the word line WLn+1 adjacent in the drain direction with respect to the read-target word line WLn is determined, and the read voltage of the read-target word line WLn is changed based on whether the second-page data is written in the memory cell adjacent to the read-target memory cell MC. Therefore, the data can be correctly read from the first flag cell FC1 connected to the read-target word line WLn, so that the read voltage of the memory cell MC can properly be set. Accordingly, the first-page data can securely be read from the memory cell MC. Additionally, it is not necessary to provide the second flag cells FC2A and FC2B, so that the area of the memory cell array can be reduced.

As illustrated in FIG. 27, a ready/busy signal becomes the L-level when the data are read from the first flag cell FC1 connected to the word line WLn+1 and the selected memory cell MC connected to the word line WLn. The ready/busy signal becomes the H-level when the first-page data is output to the outside (S55).

First-Page Read Operation

Modification

FIG. 24 illustrates a first-page read operation according to a modification of the second embodiment, and the same component as that in FIG. 23 is designated by the same sign.

In the first-page read operation in FIG. 23, when the determination that the second-page data is written in the adjacent memory cell based on the data of the first flag cell FC1 that is connected to the word line WLn+1 adjacent on the drain side with respect to the read-target word line WLn, the read voltage "BRR" is applied to the read-target word line WLn, the data is read from the first flag cell FC1 to determine whether the second-page data is written in the memory cell MC (S57 and S58).

However, in the case that the second-page data is written in the memory cell MC adjacent on the drain side, sometimes the second-page data is already written in the memory cell MC connected to the read-target word line WLn. For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1. Therefore, it is not necessary to determine the data of the first flag cell FC1 connected to the word line WLn.

In the modification, the determination whether the threshold voltage of the first flag cell FC1 connected to the word line WLn is greater than or equal to the read voltage "BRR" is omitted as illustrated in FIG. 24.

That is, when the determination that the second-page data is written in the adjacent memory cell in Step S52, the read voltage "BRR" is applied to the word line WLn to read the first-page data from the memory cell MC in Step S57 (S57). The read first-page data is output to the outside (S55).

According to the modification, the determination of the threshold voltage of the first flag cell FC1 connected to the read-target word line WLn is omitted in the case that the determination that the second-page data is written in the adjacent memory cell by determining the threshold voltage of the first flag cell FC1 that is connected to the word line WLn+1 adjacent to the read-target word line WLn. Therefore, it is possible to finish the first-page read operation in short time.

(Second-Page Read Operation)

Figure 25:
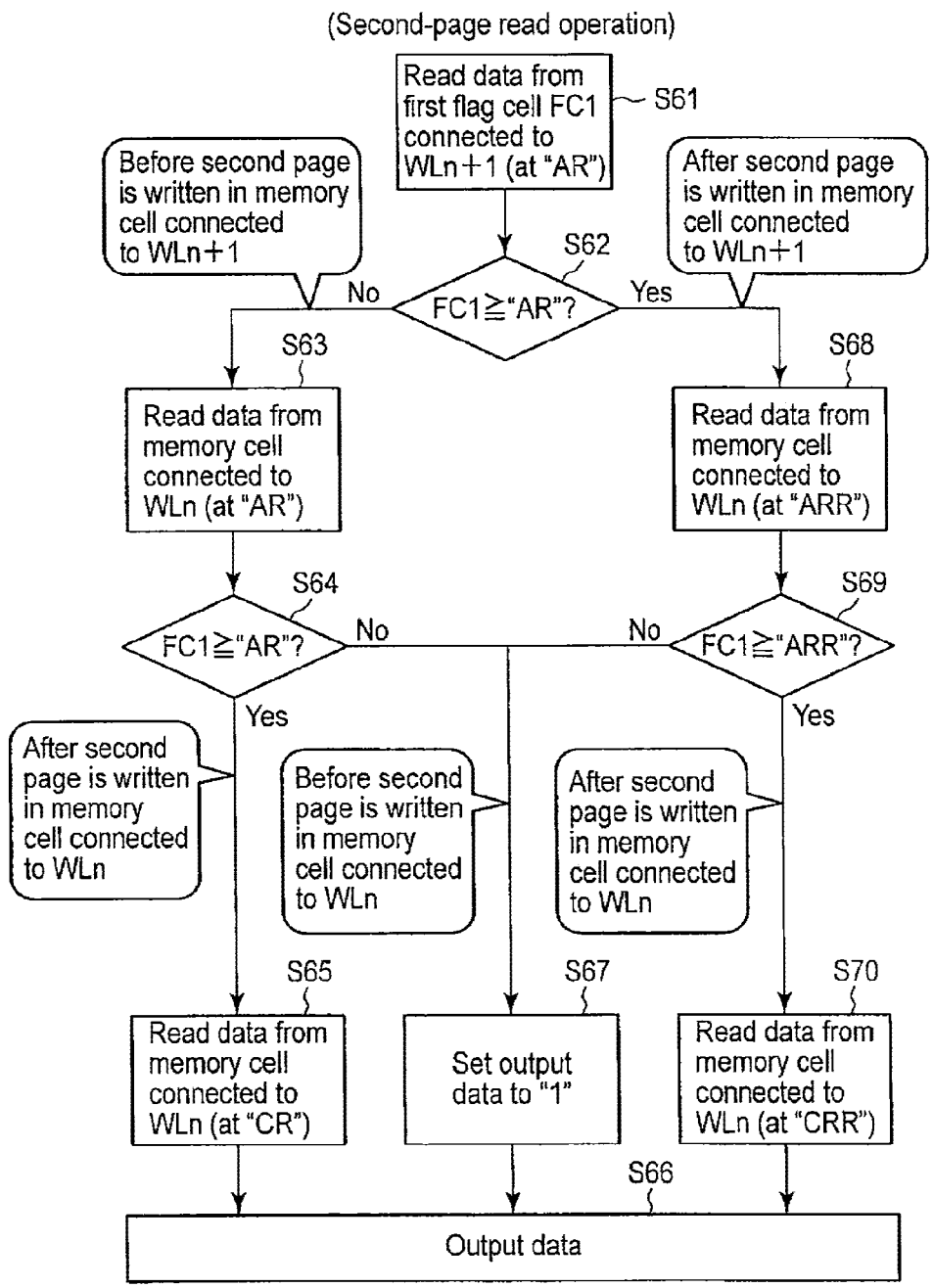
FIG. 25 is a flowchart illustrating a second-page read operation of the second embodiment.
Figure 28:
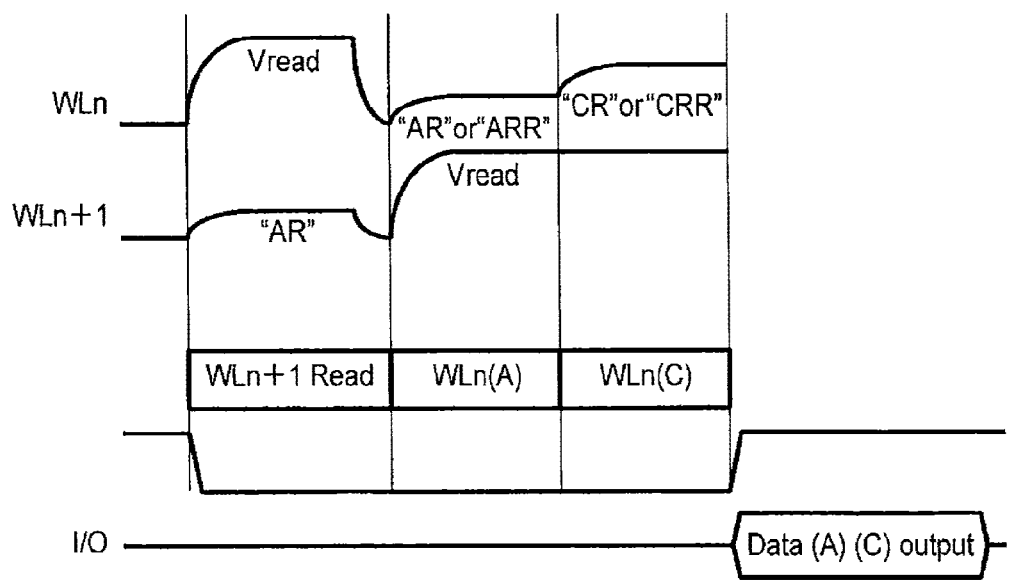
FIG. 28 is a waveform chart illustrating the second-page read operation of the second embodiment.

FIGS. 25 and 28 illustrate a second-page read operation according to the second embodiment.

In the second-page read operation, like the first-page read operation, whether the second-page data is written in the adjacent memory cell is determined by determining the threshold voltage of the first flag cell FC1 that is connected to the word line WLn+1 adjacent on the drain side with respect to the read-target word line WLn.

That is, first, for example, the read voltage "AR" is applied to the word line WLn+1, which is adjacent on the drain side with respect to the read-target word line WLn, and the data is read from the first flag cell FC1 (although either the first flag cell FC1A or the first flag cell FC1B may be used, the wider read margin is ensured in reading the first flag cell FC1B) connected to the word line WLn+1 (S61 and FIG. 28). Only the data may be read from the first flag cell FC1 in the read operation of the word line WLn+1. That is, it is not necessary to read the data from the read-target memory cell MC. Therefore, the power consumption can be suppressed such that the circuit associated with the read operation of the read-target memory cell MC is not operated (for example, the data storage circuit 10 connected to the read-target memory cell MC is not operated).

Then, whether the threshold voltage of the first flag cell FC1 connected to the word line WLn+1 is greater than or equal to the read voltage "AR" is determined (S62).

When the threshold voltage of the first flag cell FC1 is less than the read voltage "AR", and the data is not written in the second page of the memory cell MC adjacent on the drain side, the read voltage "AR" is applied to the read-target word line WLn to read the data from the memory cell MC and the first flag cell FC1 (FC1A), which are connected to the word line WLn (S63 and FIG. 28).

Then, whether the threshold voltage of the first flag cell FC1 (FC1A) is greater than or equal to the read voltage "AR" is determined (S64).

When the threshold voltage of the first flag cell FC1 (FC1A) is greater than or equal to the read voltage "AR", namely, when the second-page data is written in the memory cell MC while the second-page data is not written in the adjacent memory cell, the read voltage "CR" is applied to the word line WLn to read the second-page data from the memory cell MC (S65 and FIG. 28).

The data read at the read voltage "CR" and the second-page data read from the selected memory cell MC at the read voltage "AR" in Step S63 are output to the outside (S66).

In Step S64, when the threshold voltage of the first flag cell FC1 (FC1A) is less than the read voltage "AR", and the second-page data is not written in the memory cell MC, the output data is set to "1" (S67), and output to the outside (S66).

On the other hand, when the determination that the threshold voltage of the first flag cell FC1 (FC1A) is greater than or equal to the read voltage "AR" in Step S62, namely, when the determination that the second-page data is written in the adjacent memory cell, the read voltage "ARR" is applied to the read-target word line WLn to read the data from the first flag cell FC1 (FC1A) connected to the word line WLn (S68 and FIG. 28).

Then, whether the threshold voltage of the first flag cell FC1 (FC1A) is greater than or equal to the read voltage "ARR" is determined (S69).

When the threshold voltage of the first flag cell FC1 (FC1A) is less than the read voltage "ARR", and the second-page data is not written in the memory cell MC, the output data is set to "1" (S67), and output to the outside (S66).

When the determination that the threshold voltage of the first flag cell FC1 (FC1A) is greater than or equal to the read voltage "ARR" in Step S69, the read voltage "CRR" is applied to the word line WLn to read the second-page data from the memory cell MC connected to the word line WLn (S70), and the second-page data is output to the outside (S66).

According to the second-page read operation of the second embodiment, the determination that the second-page data is written in the memory cell MC adjacent on the drain side by determining the threshold voltage of the first flag cell FC1 that is connected to the word line WLn+1 adjacent to the read-target word line WLn, and the read voltage applied to the read-target word line WLn is changed to change the read voltage of the selected memory cell MC connected to the read-target word line WLn based on the determination result. Accordingly, the second-page data can correctly be read from the memory cell MC. Additionally, it is not necessary to provide the second flag cells FC2A and FC2B, so that the area of the memory cell array can be reduced.

As illustrated in FIG. 28, the ready/busy signal becomes the L-level when the data are read from the first flag cell FC1 connected to the word line WLn+1 and the selected memory cell MC connected to the word line WLn. The ready/busy signal becomes the H-level when the first-page data is output to the outside (S55).

(Second-Page Read Operation) (Modification)

FIG. 26 illustrates a second-page read operation according to a modification of the second embodiment, and the same component as that in FIG. 25 is designated by the same sign.

In Step S62 of FIG. 25, when the determination that the threshold voltage of the first flag cell FC1 connected to the word line WLn+1 is greater than or equal to the read voltage "AR", the read voltage "CRR" is applied to the read-target word line WLn to determine the threshold voltage of the first flag cell FC1 connected to the word line WLn, and the read voltage "CRR" is applied to the word line WLn to read the second-page data from the memory cell MC again based on the determination result.

When the second-page data is written in the memory cell that is connected to the word line WLn+1 adjacent in the drain direction with respect to the read-target word line WLn, sometimes the second-page data is also written in the memory cell MC connected to the read-target word line WLn. For example, the write sequence of the memory cells MC in FIGS. 11 and 12 is considered. The operation to write the data in the second page of the memory cells MC connected to the word line WLn is ended when the write operation is performed to the second page of the memory cells MC connected to the word line WLn+1. Therefore, it is not necessary to determine the threshold voltage of the first flag cell FC1 connected to the read-target word line WLn.

In the modification in FIG. 26, when the determination that the second-page data is written in the memory cell that is connected to the word line WLn+1 adjacent in the drain direction with respect to the read-target word line WLn in Step S62, the read voltages "ARR" and "CRR" are applied to the read-target word line WLn to read the second-page data from the memory cell MC (S68 and S69), and the read second-page data is output to the outside (S66).

According to the second-page read operation of the modification, the determination of the threshold voltage of the first flag cell FC1 connected to the read-target word line WLn is omitted in the case that the determination that the second-page data is written in the adjacent memory cell by determining the threshold voltage of the first flag cell FC1 that is connected to the word line WLn+1 adjacent in the drain direction with respect to the read-target word line WLn. Therefore, it is possible to finish the second-page read operation in short time compared with the read operation in FIG. 25. In the second embodiment, the two kinds of the first flag cells (first flag cells FC1A and FC1B) are not provided, for example, but only the first flag cell FC1B in FIG. 29 may be provided.

In the embodiments, the read condition is changed to increase the read margin depending on the write state of the adjacent word line such that the read voltage is changed, and the read operation is performed. Alternatively, the read operation is performed without changing the read condition, and the read condition is changed according to the write state of the adjacent word line like the embodiments when an error correction cannot be performed to the read data using an ECC (when the read error is generated), and the read operation may be performed again. As a result, the read operation of the memory cell connected to the word line WLn+1 can be omitted when the read margin is sufficiently ensured. The read operation can be performed again while a potential at the selected word line is slightly changed.

In the first and second embodiments, the read voltage of the read-target word line is changed. Alternatively, the read voltage of the adjacent word line may be changed during the read operation. As to the number of flag cells, the majority vote is performed using the three memory cells in FIGS. 11 and 12, and the majority vote is performed using the five memory cells in FIGS. 29 and 30. Alternatively, the number of memory cells may be increased in order to improve reliability. The data may be written in the flag cell when the number of predetermined data stored in the plurality of flag cells is greater than or equal to the target number.

In the first and second embodiments, the four-level data is stored in the memory cell by way of example. For example, the embodiments can be applied to a memory in which n-level data (n is natural numbers of 2 or more), such as eight-level data, is stored.

In the embodiments, the four-level data is described by way of example. When k-level data (k is natural numbers 3 or more) is stored in one memory cell, kind of a second flag cell further adds to the second flag cells FC2A and FC2B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reading method of a semiconductor storage device, the device including a memory cell array which includes a memory cell, the memory cell array comprising a data region in which data is stored, a first flag cell that determines whether second-page data is written in the memory cell of the data region, and a second flag cell that determines whether some data is written in the adjacent one of the memory cell, the method comprising:

reading the data in a first page operation from the memory cell, the first flag cell and the second flag cell connected to a first word line WLn (n is an integer) at a first read voltage;

determining, as a step A, whether the some data has been written in the second page of the adjacent one of the memory cell connected to a second word line WLn+1 using data of the second flag cell;

when it is determined at the step A that any data have not been written in the second page of the adjacent memory cell, determining, as a step B, whether any data has been written in the second page using a threshold voltage of the first flag cell;

when it is determined at the step B that the threshold voltage of the first flag cell is greater than or equal to the first read voltage and the second voltage has been written in the memory cell connected to the first word line WLn, applying a second read voltage to the first word line WLn to read the first-page data from the memory cell, and output the first-page data which is read outwardly;

when it is determined at the step B that the data of the first flag cell is less than the first read voltage and the second-page data has not been written in the step B, applying a third read voltage to the first word line WLn to read the first-page data from the memory cell;

when it is determined at the step A that the second-page data has been written in the adjacent memory cell, determining, as a step C, whether the second-page data are written using the threshold voltage of the first flag cell;

when it is determined at the step C that the threshold voltage of the first flag cell is greater than equal to the first read voltage and the second-page data has been written, reading the first-page data from the memory cell at the first read voltage and output the first-page data which is read outwardly; and when it is determined at the step C that the threshold voltage of the first flag cell is less than the first read voltage and the second-page data has not been written, applying the third read voltage to read the first-page data from the memory cell and output the first-page data which is read outwardly.

2. The reading method according to claim 1, wherein at the determining at the step A, the second flag cell includes three second flag cells and the determination that the write operation has been performed to the second page of the adjacent one of the memory cell is made when two or more second flag cells among the three flag cells have a threshold voltage equal to the first read voltage or more.

3. The reading method according to claim 1, wherein at the determining at the step A, the second flag cell includes m (m is a natural number of 2 or more) second flag cells and the determination that the write operation has been performed is determined by majority vote of the second flag cells in regard to the number of the second flag cells having a threshold voltage equal to the first read voltage or more.

4. The reading method according to claim 1, wherein at the step B, the reading the data from the first cell is simultaneously performed with reading the data from the second flag cell.

5. The reading method according to claim 1, wherein the first read voltage is higher than the second read voltage, and the third read voltage is lower than the first read voltage.

6. The reading method according to claim 1, wherein the memory cell array includes a NAND flash memory.

7. The reading method according to claim 5, wherein the NAND flash memory is a multi-level memory.

8. The reading method according to claim 1, wherein the device further comprises a control circuit, a bit line control circuit and a word line control circuit.

9. The reading method according to claim 8, wherein the control circuit controls the memory cell array, the bit line control circuit and the word line control circuit.

10. The reading method according to claim 8, wherein the bit line control circuit includes a data storage circuit and the read data in the reading the data is temporally stored in the data storage circuit.

* * * * *